(12) United States Patent
Chang et al.

(10) Patent No.: US 9,596,383 B2
(45) Date of Patent: Mar. 14, 2017

(54) INTERLEAVED ENCODING OF COMPRESSED ATTRIBUTE AND COLOR PLANES

(71) Applicant: KYOCERA Document Solutions Inc., Osaka (JP)

(72) Inventors: Michael M. Chang, El Segundo, CA (US); Kenneth A. Schmidt, El Segundo, CA (US); Dongpei Su, El Segundo, CA (US); Sheng Li, El Segundo, CA (US); Kendrick Wong, El Segundo, CA (US); Larry Lubman, El Segundo, CA (US); Alfred Abkarian, El Segundo, CA (US); Stephen L. Schafer, El Segundo, CA (US)

(73) Assignee: KYOCERA Document Solutions Inc. (JP)

( * ) Notice: Subject to any disclaimer, the term of this patent is extended or adjusted under 35 U.S.C. 154(b) by 0 days.

(21) Appl. No.: 15/070,512

(22) Filed: Mar. 15, 2016

(65) Prior Publication Data
US 2016/0227075 A1 Aug. 4, 2016

Related U.S. Application Data

(63) Continuation of application No. 14/610,247, filed on Jan. 30, 2015, now Pat. No. 9,319,565.

(51) Int. Cl.
*G06F 3/12* (2006.01)
*H04N 1/60* (2006.01)
(Continued)

(52) U.S. Cl.
CPC .......... *H04N 1/6016* (2013.01); *G06F 3/122* (2013.01); *G06F 3/1213* (2013.01);
(Continued)

(58) Field of Classification Search
None
See application file for complete search history.

(56) References Cited

U.S. PATENT DOCUMENTS 5,524,067 A 6/1996 Miyake et al.
5,742,704 A 4/1998 Suzuki et al.
(Continued)

FOREIGN PATENT DOCUMENTS

EP 0856988 8/1998
JP 2013258701 12/2013

OTHER PUBLICATIONS

Final Office Action mailed on Dec. 28, 2015, issued in connection with U.S. Appl. No. 14/610,101, filed Jan. 30, 2015, 25 pages.
(Continued)

*Primary Examiner* — Dov Popovici
(74) *Attorney, Agent, or Firm* — McDonnell Boehnen Hulbert & Berghoff LLP

(57) ABSTRACT

An example embodiment may involve obtaining an a×b pixel macro-cell from an image with one or more color planes, and an a×b attribute macro-cell. The a×b pixel macro-cell may contain 4 non-overlapping m×n pixel cells, and the a×b attribute macro-cell may contain 4 non-overlapping m×n attribute cells. The pixels in the a×b pixel macro-cell may be associated with respective color values. The example embodiment may also involve determining 4 attribute output values associated respectively with the 4 non-overlapping m×n attribute cells. The example embodiment may further involve determining 1 to 4 color-plane output values for the non-overlapping m×n pixel cells, and writing an interleaved representation of the 4 attribute output values and the determined color-plane output values.

20 Claims, 15 Drawing Sheets

(51) Int. Cl.
*H04N 1/64* (2006.01)
*H04N 1/21* (2006.01)
*H04N 1/32* (2006.01)
*G06K 15/00* (2006.01)

(52) U.S. Cl.
CPC ....... *H04N 1/2166* (2013.01); *H04N 1/32379* (2013.01); *H04N 1/603* (2013.01); *H04N 1/642* (2013.01); *H04N 1/644* (2013.01); *H04N 1/648* (2013.01); *H04N 2201/0094* (2013.01)

(56) References Cited

U.S. PATENT DOCUMENTS

| | | | |
|---|---|---|---|
| 5,915,079 | A | 6/1999 | Vondran, Jr. et al. |
| 6,122,403 | A | 9/2000 | Rhoads |
| 6,125,201 | A | 9/2000 | Zador |
| 6,266,150 | B1 | 7/2001 | Brossman et al. |
| 6,285,458 | B1 | 9/2001 | Yada |
| 6,515,756 | B1 | 2/2003 | Mastie et al. |
| 6,529,633 | B1 | 3/2003 | Easwar et al. |
| 7,145,696 | B2 | 12/2006 | Silverbrook et al. |
| 7,352,490 | B1 | 4/2008 | Tse et al. |
| 7,751,633 | B1 | 7/2010 | Mukherjee |
| 8,218,908 | B2 | 7/2012 | Ilbery |
| 8,265,401 | B2 | 9/2012 | Yoshimura |
| 8,280,159 | B2 | 10/2012 | Kojima et al. |
| 8,280,160 | B2 | 10/2012 | Matsuoka |
| 8,422,778 | B2 | 4/2013 | Matsuoka |
| 8,508,449 | B2 | 8/2013 | Broughton et al. |
| 8,805,069 | B2 | 8/2014 | Li et al. |
| 8,885,706 | B2 | 11/2014 | Bankoski et al. |
| 8,965,138 | B2 | 2/2015 | Mochizuki et al. |
| 8,983,185 | B2 | 3/2015 | Deng et al. |
| 9,137,418 | B2 | 9/2015 | Tsugimura |
| 9,319,565 | B1 | 4/2016 | Chang et al. |
| 2004/0036920 | A1 | 2/2004 | Lapstun et al. |
| 2005/0078754 | A1 | 4/2005 | Liang et al. |
| 2005/0213125 | A1 | 9/2005 | Smith et al. |
| 2006/0265197 | A1 | 11/2006 | Peterson |
| 2007/0201751 | A1 | 8/2007 | Wu et al. |
| 2007/0288219 | A1 | 12/2007 | Zafar et al. |
| 2008/0170626 | A1 | 7/2008 | Sung et al. |
| 2012/0154420 | A1 | 6/2012 | Calandrino et al. |
| 2013/0329237 | A1 | 12/2013 | Li et al. |
| 2013/0329995 | A1 | 12/2013 | Webb et al. |
| 2014/0097250 | A1 | 4/2014 | Antognini et al. |
| 2014/0111830 | A1 | 4/2014 | Su et al. |
| 2014/0355010 | A1 | 12/2014 | Hara et al. |
| 2015/0092210 | A1 | 4/2015 | Tsugimura |
| 2015/0092860 | A1 | 4/2015 | Benight |
| 2016/0019714 | A1 | 1/2016 | Kruglick |

OTHER PUBLICATIONS

Notice of Allowance mailed on Mar. 9, 2016, issued in connection with U.S. Appl. No. 14/610,101, filed Jan. 30, 2015, 11 pages.
Notice of Allowance mailed on Feb. 11, 2016, issued in connection with U.S. Appl. No. 14/610,126, filed Jan. 30, 2015, 9 pages.
Notice of Allowance mailed on Feb. 16, 2016, issued in connection with U.S. Appl. No. 14/610,178, filed Jan. 30, 2015, 11 pages.
Notice of Allowance mailed on Dec. 17, 2015, issued in connection with U.S. Appl. No. 14/610,247, filed Jan. 30, 2015, 19 pages.
Office Action mailed on Aug. 11, 2015, issued in connection with U.S. Appl. No. 14/610,101, filed Jan. 30, 2015, 14 pages.
Office Action mailed on May 3, 2016, issued in connection with U.S. Appl. No. 14/610,201, filed Jan. 30, 2015, 9 pages.
Office Action mailed on Aug. 26, 2015, issued in connection with U.S. Appl. No. 14/610,247, filed Jan. 30, 2015, 28 pages.
Extended European Search Report and Opinion for App. No. EP 13171543.5, mailed Mar. 5, 2014, 7 pages.
"JPEG," from Wikipedia, en.wikipedia.org/wiki/JPEG accessed Jul. 31, 2012, pp. 1-16.
"YCbCr," from Wikipedia, en.wikipedia.org/wiki/YCbCr accessed Jul. 31, 2012, pp. 1-5.

```
1  foreach composite qCell in (input raster)
2    // the input raster may be a page, band, or subband
3    sort( composite qCell, by planar order of( A, C, M, Y, K) )
4    foreach pCell in (qCell)
5      foreach plane in (qCell)
6        if planar qCell should be subsampled then
7          if first pCell then
8            emit( 8x8_DCT_encode(subsample(planar qCell)) )
9          else
10           // don't emit anything for pCells 1-4
11       else
12         emit( 8x8_encode(planar pCell) )
13       endif
14     endfor // plane
15   endfor // composite pCell
16 endfor // composite qCell
```

INTERLEAVED ENCODING OF COMPRESSED ATTRIBUTE AND COLOR PLANES

CROSS-REFERENCE TO RELATED APPLICATION

This application is a continuation of and claims priority to U.S. Pat. No. 9,319,565, filed Jan. 30, 2015 and issued Apr. 19, 2016, which is hereby incorporated by reference in its entirety.

BACKGROUND

In recent years, various types of printing devices have become popular for both business and consumer use. In addition to traditional black and white printers, color printers, scanners, copiers, fax machines, and other components are now common. Multi-function peripherals (MFPs), that support two or more of these operations, are also widely available. As these devices have grown more prevalent, they are being used for processing of more sophisticated and complicated documents.

SUMMARY

A first example embodiment may involve obtaining an m×n pixel cell from an input image. The input image may contain more than m×n pixels, and each of the m×n pixels in the m×n pixel cell may be associated with at least one color value. The first example embodiment may also involve, possibly based on the m×n pixel cell, obtaining an m×n attribute cell. Elements of the m×n attribute cell may be associated in a one-to-one fashion with respective pixels in the m×n pixel cell, and the elements may identify respective control data related to their associated pixels. The first example embodiment may further involve compressing the m×n pixel cell in a lossy fashion, and the m×n attribute cell in a lossless fashion. Compression of the m×n pixel cell may be based on at least part of the m×n attribute cell. The first example embodiment may additionally involve writing an interleaved representation of the compressed m×n pixel cell and the compressed m×n attribute cell to an output medium.

A second example embodiment may involve obtaining an a×b pixel macro-cell from an input image. The a×b pixel macro-cell may contain 4 non-overlapping m×n pixel cells, where the a×b pixels in the a×b pixel macro-cell have respective color values and are associated with respective object type tags. The second example embodiment may also involve, possibly based on the respective color values and the respective object type tags, selecting a compression technique to either (i) compress the a×b pixel macro-cell as a whole, or (ii) compress the a×b pixel macro-cell by compressing each of the 4 non-overlapping m×n pixel cells separately. The second example embodiment may further involve compressing the a×b pixel macro-cell according to the selected compression technique. The second example embodiment may additionally involve writing a representation of the compressed a×b pixel macro-cell to a computer-readable output medium.

A third example embodiment may involve obtaining an a×b pixel macro-cell from an input image with one or more color planes, and an a×b attribute macro-cell. The a×b pixel macro-cell may contain 4 non-overlapping m×n pixel cells and the a×b attribute macro-cell may contain 4 non-overlapping m×n attribute cells. The a×b pixels in the a×b pixel macro-cell may be associated with respective color values, and elements of the a×b attribute macro-cell may be associated in a one-to-one fashion with respective pixels in the a×b pixel macro-cell. The third example embodiment may also include determining 4 attribute-plane output values associated respectively with the 4 non-overlapping m×n attribute cells. The third example embodiment may further include determining 1 to 4 color-plane output values for the non-overlapping m×n pixel cells. The third example embodiment may additionally include writing an interleaved representation of the 4 attribute-plane output values and the determined color-plane output values to a computer-readable output medium.

A fourth example embodiment may include a non-transitory, computer-readable storage medium, having stored thereon program instructions that, upon execution by a computing device, cause the computing device to perform operations in accordance with the first, second, and/or third example embodiments.

A fifth example embodiment may include a computing device containing at least a processor and data storage. The data storage may include program instructions that, when executed by the processor, cause the computing device to perform operations in accordance with the first, second, and/or third example embodiments.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

BRIEF DESCRIPTION OF THE DRAWINGS

FIG. 10 depicts pseudo-code for interleaved encoding, according to example embodiments.

FIG. 11A depicts cells of four planes, according to example embodiments.

FIG. 11B depicts the cells of FIG. 11A interleaved on an output medium, according to example embodiments.

DETAILED DESCRIPTION OF THE DRAWINGS

Figure 1:
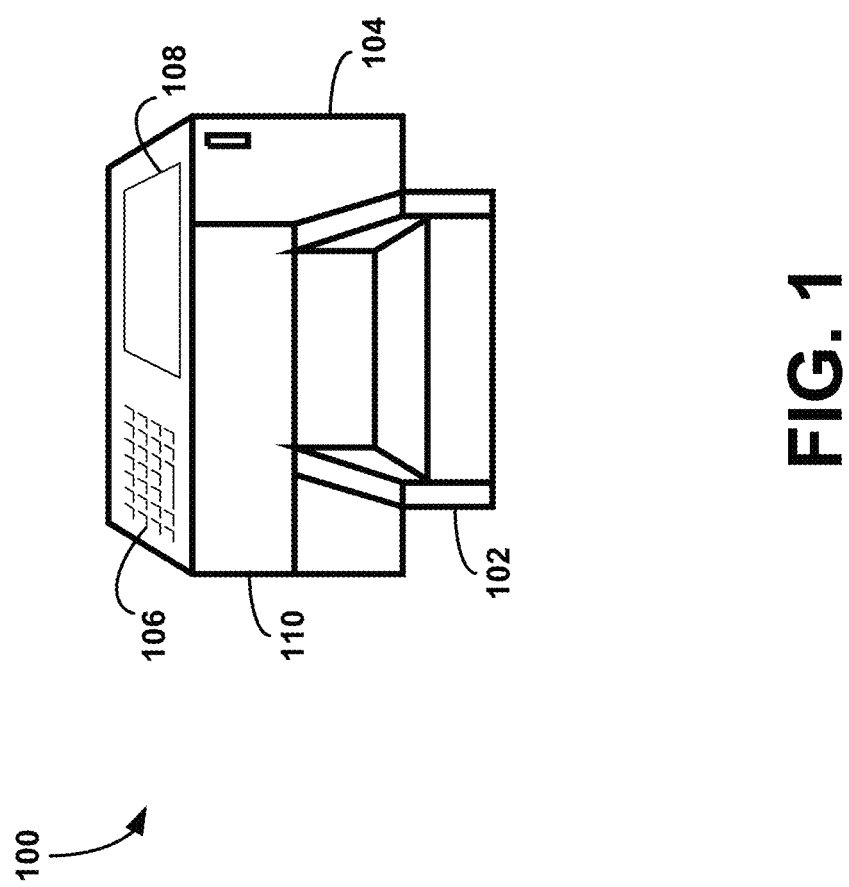
FIG. 1 depicts a printing device, according to example embodiments.

Example methods and systems are described herein. Other example embodiments or features may further be utilized, and other changes may be made, without departing from the scope of the subject matter presented herein. In the following detailed description, reference is made to the accompanying figures, which form a part thereof.

The example embodiments described herein are not meant to be limiting. Thus, aspects of the present disclosure, as generally described herein and illustrated in the figures, can be arranged, substituted, combined, separated, and designed in a wide variety of different configurations, all of which are explicitly contemplated herein.

1. INTRODUCTION

Printing technology has evolved over the last 30-plus years from simple dot-matrix-based output devices producing only black and white images to today's advanced laser-based printing devices that can produce high-resolution color images. Additionally, modern printing devices may also function as copiers, scanners, and fax machines. To do so, they may be able to store numerous electronic documents that are queued for printing or faxing, or that have been scanned. Thus, many printing devices are specialized forms of computing devices that may include, for example, one or more processors, data storage, and input/output interfaces.

Regardless of whether a printing device is used in a residence, a business, or in another type of location, the printing device may be a shared resource that can be communicatively coupled to various other computing devices. Consequently, in some environments, the storage requirements of a printing device may be quite high, as numerous computing devices may be transmitting electronic documents to the printing device for printing. Typically, a printing device will print, copy, fax, and/or scan one electronic document at a time, in a first-come-first-served fashion. Therefore, the printing device may store a potentially large number of electronic documents that are waiting to be serviced. Additionally, some electronic documents, such as overlay documents containing background images or logos, may be stored in a printing device indefinitely, as these electronic documents may be applied to multiple print jobs.

Since the cost of data storage (e.g., memory such as random access memory (RAM), solid-state memory, hard-drive memory, and/or flash memory) can be expensive, it may be beneficial to compress the stored electronic documents, in order to reduce the data storage requirements of the printing device. Additionally, since some electronic documents may be transferred to and/or from the printing device and a computing device, compressing these electronic documents may make transfers faster and use less network capacity.

Moreover, since print jobs may be large (e.g., a print job may include one or more electronic documents encompassing hundreds of pages), compressing queued print jobs saves short-term storage space before each job is printed. In addition, users may want to save print jobs in long-term storage for printing at a later time. Thus, compressing print jobs may allow more print jobs to be saved. Furthermore, the act of storing and retrieving large print jobs from long-term memory can be slow, but it may be expedited by compressing the print jobs to make them smaller in size.

2. EXAMPLE PRINTING DEVICE

FIG. 1 depicts an example printing device 100. Printing device 100 may be configured to print partially-stored and/or fully-stored electronic documents on various types of physical output media. These output media include, but are not limited to, various sizes and types of paper, overhead transparencies, and so on. Printing device 100 may be interchangeably referred to as a "printer."

Printing device 100 may serve as local peripheral to a computing device, such as a personal computer, a server device, a print server, etc. In these cases, printing device 100 may be attached to the computing device by cable, such as a serial port cable, parallel port cable, Universal Serial Bus (USB) cable, Firewire (IEEE 1394) cable, or High-Definition Multimedia Interface (HDMI) cable. Thus, the computing device may serve as a source of electronic documents for printing device 100.

On the other hand, printing device 100 may include a wireline or wireless network interface, such as an Ethernet or 802.11 (Wife) interface. So arranged, printing device 100 may serve as a printing device for any number of computing devices that can communicate with printing device 100 over a network. In some embodiments, printing device 100 may serve as both a local peripheral and a networked printer at the same time. In order to use printing device 100, computing devices may install one or more printer drivers. These printer drivers may include software components that convert the electronic documents to be printed from various local representations stored on the computing devices to one or more representations supported by printing device 100.

Regardless, printing device 100 may be considered to be a non-generic type of computing device, and may carry out both printing-related and non-printing related tasks. For instance, printing device 100 may also include copier, fax, and scanner functions. In some embodiments, printing device 100 may use a scanning unit to facilitate copier and/or fax functions. For instance, printing device 100 may scan a physical document into an electronic format, and then print the resulting electronic document to provide a copy, and/or transmit the resulting electronic document via a telephone interface to provide a fax operation. Additionally, printing device 100 may be able to receive a faxed electronic document via a telephone interface, and then compress and store a representation of this electronic document.

In order to support its various capabilities, printing device 100 may include a document feeder/output tray 102, paper storage 104, user interface 106, scanning element 108, and chassis 110. It should be understood that printing devices may take on a wide variety of forms. Therefore printing device 100 may include more or fewer components than depicted in FIG. 1, and/or components arranged in a different fashion than depicted in FIG. 1.

Document feeder/output tray 102 may hold physical documents (e.g., a stack of one or more sheets of paper) that are to be scanned, copied or faxed. Advantageously, document feeder/output tray 102 may allow printing device 100 to automatically feed multiple physical documents for processing by printing device 100 without requiring manual intervention. Document feeder/output tray 102 may also include one or more separate output trays for holding physical documents that have been processed by printing device 100. These may include physical documents that have been scanned, copied or faxed by printing device 100, as well as physical documents that have been produced by, e.g., the fax and/or copying functions of printing device 100.

Paper storage 104 may include trays and/or feeding elements for various types of physical media. For instance, paper storage 104 may include separate trays for 8.5×11 inch paper, A4 paper, letterhead paper, envelopes, and so on. For any operation of printing device 100 that involves outputting physical media (e.g., printing, copying, and/or receiving a fax), paper storage 104 may supply the physical media.

User interface 106 may facilitate the interaction of printing device 100 with a human or non-human user, such as to receive input from a user and to provide output to the user. Thus, user interface 106 may include input components such as a keypad, keyboard, touch-sensitive or presence-sensitive panel, joystick, microphone, still camera and/or video camera. User interface 106 may also include one or more output components such as a display screen (which, for example, may be combined with a presence-sensitive panel), a cathode ray tube (CRT), a liquid crystal display (LCD), a light emitting diode (LED) based display, a display using digital light processing (DLP®) technology, a light bulb, and/or one or more other similar devices, now known or later developed. User interface 106 may also be configured to be able to generate audible output(s), via a speaker, speaker jack, audio output port, audio output device, earphones, and/or other similar devices, now known or later developed in the future.

Scanning element 108 may be a glass panel below which a movable light source operates to scan physical media placed on top of the glass panel. Alternatively, a digital camera below the glass panel may "scan" the physical media placed on top of the glass panel by taking a picture of the physical media. Images of scanned physical media may be stored in data storage associated with printing device 100.

Chassis 110 may include a physical housing that contains and/or interconnects various components of printing device 100, such as document feeder/output tray 102, paper storage 104, user interface 106, and scanning element 108. Additionally, chassis 110 may house other components not shown in FIG. 1. For example, chassis 110 may contain one or more toner cartridges, liquid ink jets, belts, rollers, and/or power supplies. Further, chassis 110 may include communication interfaces, such as a wireline and/or wireless network interfaces, a telephony interface (e.g., a RJ45 jack), a USB interface, a BLUETOOTH® interface, a card reader port, etc.

Figure 2:
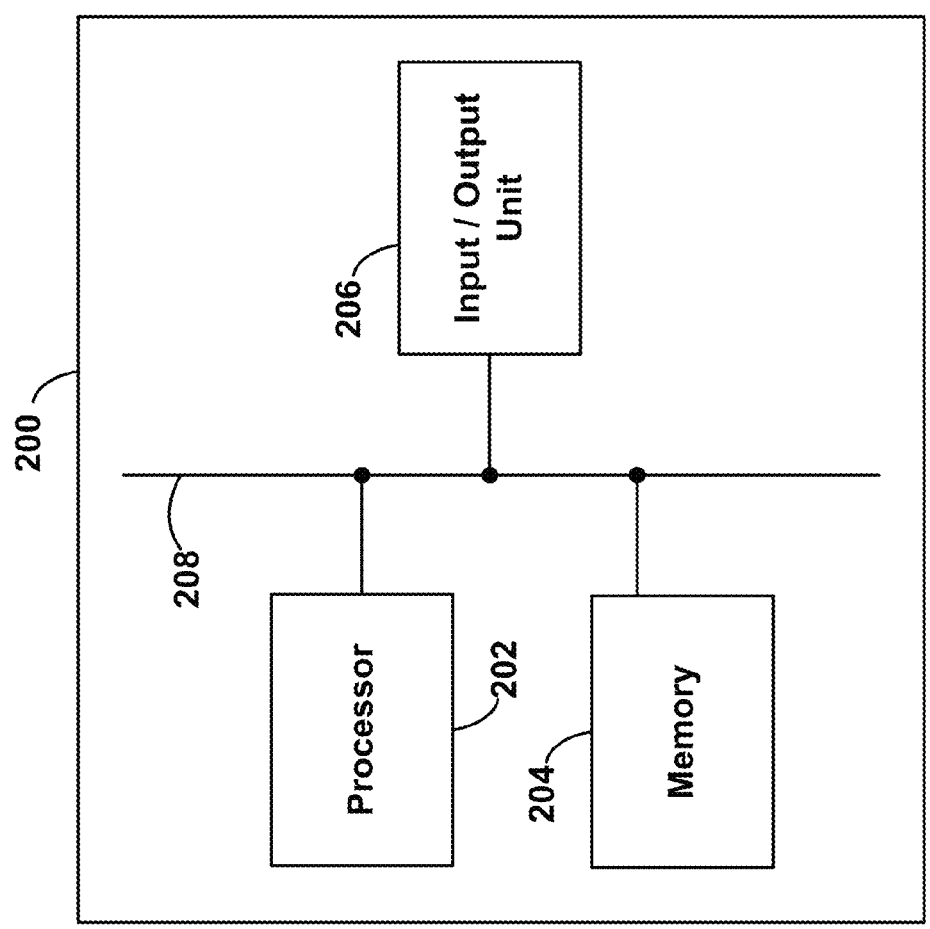
FIG. 2 is a block diagram illustrating computing components of a printing device, according to example embodiments.

Moreover, as printing device 100 may be based on general-purpose and/or specially-designed computing device components, chassis 110 may also house some or all of these components. To that point, FIG. 2 depicts an example embodiment 200 of computing device components (e.g., functional elements of a computing device) that may be included in printing device 100.

Computing device components 200 may include a processor 202, memory 204, and input/output unit 206, all of which may be coupled by a system bus 208 or a similar mechanism. Processor 202 may include one or more central processing units (CPUs), such as one or more general purpose processors and/or one or more dedicated processors (e.g., application specific integrated circuits (ASICs) or digital signal processors (DSPs), etc.).

Memory 204, in turn, may comprise volatile and/or non-volatile data storage and can be integrated in whole or in part with processor 202. Memory 204 may store program instructions, executable by processor 202, and data that are manipulated by these instructions to carry out the various methods, processes, or functions described herein. Alternatively, these methods, processes, or operations can be defined by hardware, firmware, and/or any combination of hardware, firmware and software. Therefore, memory 204 may include a tangible, non-transitory computer-readable medium, having stored thereon program instructions that, upon execution by one or more processors, cause printing device 100 to carry out any of the methods, processes, or functions disclosed in this specification or the accompanying drawings.

Memory 204 may also be configured to store compressed and non-compressed electronic documents that may later be processed (e.g., printed). Thus, memory 204 may serve as an output medium for these electronic documents.

Input/output unit 206 may include any of the operations and/or elements described in reference to user interface 106. Thus, input/output unit 206 may serve to configure and/or control the operation of processor 202. Input/output unit 206 may also provide output based on the operations performed by processor 202.

These examples of a printing device are provided for illustrative purposes. In addition to and/or alternatively to the examples above, other combinations and/or sub-combinations of printer and computer technologies may also exist, amongst other possibilities, without departing from the scope of the embodiments herein.

Figure 3:
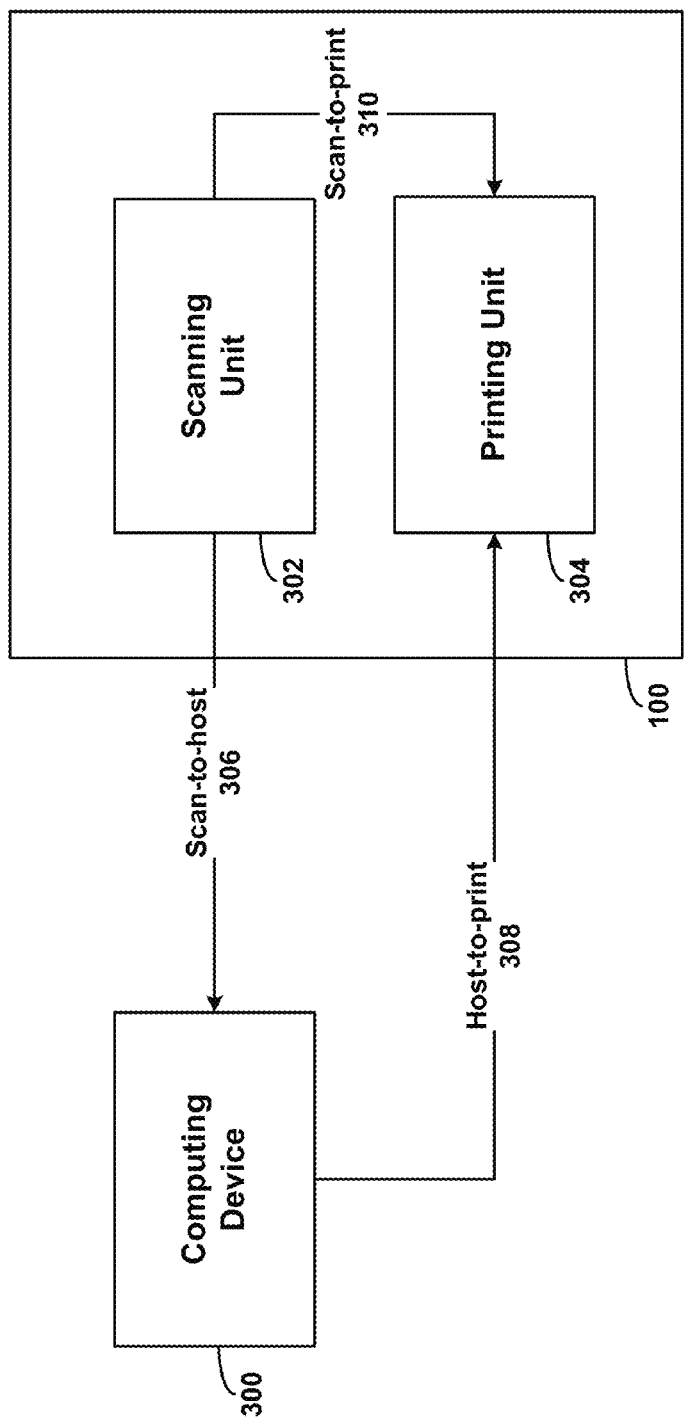
FIG. 3 is a block diagram illustrating various data paths involving a printing device, according to example embodiments.

FIG. 3 depicts some of the possible data paths through which a representation of an electronic document processed by printing device 100 may pass. In FIG. 3 it is assumed that printing device 100 may include a scanning unit 302 and a printing unit 304. Control of each of these units may be implemented in hardware, firmware, software, or any combination of hardware, firmware and/or software. Additionally, each of scanning unit 302 and printing unit 304 may communicate with computing device 300, and possibly with other computing devices as well. In some situations, the data paths supported by printing device 100 may be referred to a "pipelines."

A scan-to-print data path 310 may be supported by scanning unit 302 and printing unit 304. Scan-to-print data path 310 may be used, e.g., when a user instructs printing device 100 to copy a physical document. In response to this instruction, scanning unit 302 may scan the physical document into an electronic document, and transmit the electronic document via scan-to-print data path 310 to printing unit 304. Use of scan-to-print data path 310 may involve at least temporarily storing some or all of the electronic document (possibly in a compressed format) in the data storage of printing device 100. Then, printing unit 304 may print the electronic document to physical media (e.g., one or more sheets of paper).

A scan-to-host data path 306 may also be supported by scanning unit 302 and computing device 300. Scan-to-host data path 306 may be used, e.g., when a user instructs printing device 100 to scan a physical document. The user may also instruct printing device 100 to transmit a representation of the resulting electronic document to computing device 300, or printing device 100 may be pre-configured to automatically transmit the electronic document to computing device 300. Thus, in response to this instruction, scanning unit 302 may scan the physical document into an electronic document, and transmit the resulting electronic document via scan-to-host data path 306 to computing device 300. Use of scan-to-print data path 310 may involve at least temporarily storing (possibly in a compressed format) some or all of the electronic document in the data storage of printing device 100, and transmitting a representation of the resulting electronic document to computing device 300.

A host-to-print data path 308 may be supported by computing device 300 and printing unit 304. Host-to-print data path 308 may be used, e.g., when a user instructs computing device 300 to print an electronic document on printing device 100. In response to this instruction, computing device 300 may transmit a representation of the electronic document to printing unit 304. Printing device 100, via printing unit 304, may print the electronic document to physical media. Some, or all, of the electronic document may be stored (possibly in a compressed format) in the data storage of printing device 100 before and/or during the printing of the electronic document.

Clearly, for at least one of the data paths discussed above, as well as possibly other data paths supported by printing device 100, an electronic document may require storage and/or transmission over a network or a cable. The efficiency of both the storage and transmission of electronic documents can be improved by compressing these electronic documents for storage and/or transmission. For example, if electronic documents can, on average be compressed to one-quarter their initial size, then about four times as many electronic documents can be stored in a fixed amount of data storage. Further, the transmission of these compressed electronic documents over a network or cable can occur about four times as fast as would transmission of the uncompressed electronic documents.

In the past, lossy compression may have been used for some data paths, while lossless compression may have been used for other data paths. (Lossy compression techniques compress data by discarding some of it, while lossless compression techniques compress data without discarding any of it.). For example, in some implementations, host-to-print data path 308 may utilize lossless compression in order to preserve sharp edges of text and line art in printed versions of electronic documents. On the other hand, scan-to-host data path 306 and scan-to-print data path 310 may utilize lossy compression in order to efficiently store and transmit scanned physical documents containing graphical images. Printing device 100 may be made more efficient and its software and/or hardware implementation may be simplified by using the same or a similar compression technique for at least some (and perhaps all) of its data paths.

Thus, a compression technique that supports both lossless and lossy compression is desirable. It is also desirable for both lossless and lossy compression to be able to be applied within the same document. To that point, an understanding of how images are presented may be useful.

3. EXAMPLE IMAGE

Figure 4:
FIG. 4 depicts an image that may be contained in an electronic document, according to example embodiments.

An image may be a matrix of pixels encoded according to an image format and a color model. FIG. 4 depicts an image 400 that may be included on or within a physical or electronic document handled by printing device 100. While image 400 appears in black and white, color images with similar characteristics may also be handled by printing device 100. Image 400 may be formed using various resolutions, such as 600 dots per inch (dpi) or 1200 dpi among other examples.

As can be seen in FIG. 4, image 400 contains various types of content. For instance, image 400 contains both text and line art with sharp edges. Further, image 400 also contains sections containing a continuous tone (e.g., the upper-left-hand corner of image 400), as well as sections containing photorealistic data (e.g., the lower-right-hand corner and upper-right-hand corner of image 400). Text overlays various sections of image 400. Thus, image 400 illustrates a common type of image that is used in business printing, e.g., in pages of a brochure, magazine, flyer, or advertisement.

In some possible embodiments, each of the pixels in an image, such as example image 400, may be categorized as one of three different object types: image graphics, vector graphics, or text. Image graphics include photorealistic images, such as images from photographs. The photorealistic data in the lower-right-hand corner and upper-right-hand corner of image 400 may qualify as image graphics. The non-text lines throughout image 400 may qualify as vector graphics, and the textual characters (e.g., the "E" and the "R" for instance) may qualify as text.

The object type of a particular pixel may be determined by or from a page description language (PDL) representation of an electronic document. A PDL is a language, grammar, or format that describes the appearance of a printed or displayed page at a higher level than the page's actual pixels. A pixel representation of a page may be derived from a PDL.

Thus, an electronic document may contain one or more pages that are represented by a PDL document. Each of these pages may be represented by part or all of a PDL document, and/or by an image. There are many examples of PDLs, of which the Portable Document Format (PDF) is one.

A unified compression technique may be able to accurately represent the sharp edges and lines of image 400, while still using lossy compression in order to reduce the storage requirements of an electronic document containing image 400. Particularly, it is desirable to preserve the exact characteristics of certain elements, such as text, basic geometric shapes, and line drawings, because even minor distortions to these elements can appear unpleasing to the human eye. Thus, these elements may be categorized as vector graphics or text, and may be targeted for compression in a lossless fashion.

On the other hand, photorealistic images and complex graphics with gradients can be viewed without such exactness. Thus, these elements may be categorized as image graphics, and may be targeted for compression in a lossy fashion. For instance, image graphics may be compressed in a manner such that they appear visually the same or similar to the human eye as their respective uncompressed versions.

Further, the object type of a pixel (e.g., image graphics, vector graphics, or text), may influence a color conversion applied to the pixel, as well as the type of halftone screen applied to the pixel. These issues are discussed in more detail below.

In some cases, vector graphics and text objects may appear to have similar characteristics. Indeed, these two categories can be combined in some embodiments, and processed in the same fashion. However, certain types of vector graphics, such as lightly-colored lines, appear better when processed differently from text. For instance, if lightly colored lines are processed in the same fashion as text, some of these lines may become difficult to distinguish. Consequently, applying a different color conversion and/or a different halftone screen to vector graphics may preserve and/or enhance these lines. For instance, the halftone screen selected specifically for a vector graphics pixel may result in more toner being applied when this pixel is printed.

4. EXAMPLE IMAGE COLOR MODELS

Electronic documents can be represented using a number of color models. Thus, a robust compression technique should be able to operate on some or all of these models. Further, the compression technique may include preprocessing that is specific to individual color models.

For example, the red-green-blue (RGB) color model may be used for display of images on electronic output devices, such as televisions, monitors, and computer screens. RGB is an additive color model in which red, green, and blue light are added together in various ways to produce a spectrum of colors. For instance, cyan may be formed by combining green and blue, yellow may be formed by combining red and green, magenta may be formed by combining red and blue, and white may be formed by combining red, green, and blue.

A particular pixel of an RGB image may be expressed as a three-plane tuple (R,G,B), each plane of which can vary from zero to a pre-defined maximum value (e.g., 255). If all of the planes are 0, the result may be black. If all of the planes are at the maximum value, the result may be the brightest representable white. (The color planes described herein may also be referred to as color channels.)

RGB output is typically device-dependent, in that different output devices may display the same RGB image in a different fashion. Thus, in some cases, these differences may be perceivable by humans. In some embodiments, physical documents scanned into printing device 100 using scan-to-host data path 306 may be encoded using an RGB color model.

The cyan-magenta-yellow (CMY) color model may be used for the printing of color images by printing devices. CMY is a subtractive color model in which cyan, yellow, and magenta are applied to a white surface in various ways to reproduce a spectrum of colors. For instance, red can be formed by combining magenta and yellow, blue can be formed by combining cyan and magenta, and green can be formed by combining cyan and yellow. Thus, the CMY color model might be considered a complement of the RGB color model.

A particular pixel of a CMY image may be expressed as a three-plane tuple (C,M,Y), each plane of which can vary from 0 to a pre-defined maximum value. If all of the planes are at 0, the result may be white. If all of the planes are at the maximum value, the result may be black.

Like, RGB output, CMY output is typically device-dependent, in that the printed output of the same CMY image on different printing devices may appear to be different. In some cases, these differences may be perceivable by humans. In some embodiments, electronic documents printed by printing device 100 using host-to-print data path 308 and/or scan-to-print data path 310 may be encoded using a CMY color model.

In some embodiments, a four-plane CMYK color model can also be used. This four-plane model of CMYK may be similar to or the same as the CMY color model, with the exception that a key (black) plane is also used. In addition to possibly combining cyan, magenta, and yellow to form black, the separate key (black) ink source may be used to form black. Thus, a particular pixel of a CMYK image may be expressed as a four-plane tuple (C,M,Y,K), each plane of which can vary from zero to a pre-defined maximum value.

Using the CMYK color model, the same colors as the CMY model can be supported, but less ink is typically used because the K colorant can replace mixtures of the C, M, and Y colorants. However, the CMYK color model may not always be able to be conveniently converted to and from other color models, because the addition of the K colorant adds redundancy, e.g., the same color can be a result of mixing different C, M, Y, and K combinations. In some embodiments, one or more color tables may be used to convert pixels from the CMY model to the CMYK model, and/or between other pairs of color models.

An additional color model is gray, also referred to as grayscale, which may be used for the representation of black and white images. Unlike the RGB and CMY/CMYK color models, each pixel of the gray color model is expressed using a single plane (K) that encodes the pixel's intensity. The values used by the gray plane can vary from zero for black, to a pre-defined maximum value for white (e.g., 255). In some embodiments, one or more of the data paths supported by printing device 100 may be able to encode images using the gray color model.

Another color model is YCbCr. In some implementations, this color model may be used as an alternative representation of an image. Particularly, the Y plane may represent the brightness of a pixel, and the Cb and Cr planes may represent the blue-yellow chrominance and red-green chrominance, respectively. The YCbCr color model has a well-defined relationship with the RGB and CMY color models and can be converted to and from either of these color models with relative ease.

An additional advantage to the YCbCr color model is that compression of images encoded using the YCbCr color model tends to be more efficient than compression of images encoded in the RGB or CMY/CMYK color models. Particularly, the human eye is not very good at detecting high-frequency (e.g., rapidly varying) chrominance information in an image. Thus, images encoded using the YCbCr color model can exploit this information by ignoring high-frequency components of the Cb and Cr planes. So, images encoded in a particular color model may be converted to the YCbCr color model before compression in order to improve compression performance.

5. EXAMPLE ATTRIBUTE PLANE

In addition to color planes, an image may be digitally represented using an attribute plane. While the values of the attribute plane might not appear visibly in the image, the attribute plane may be used to provide guidance to image compression and processing operations.

As an example, each pixel in an image may be associated with an array of bits (e.g., 8 bits or 16 bits) representing attributes. Some of these attributes may indicate whether a pixel is used as an overlay on top of other materials, or being used as part of a printing or a copying feature. Other attributes may include a reference to a neutral color preservation technique, a color conversion table to use when converting the pixel between color models, and/or a reference to a halftone screen to use when printing the pixel.

An array of the attribute plane may be used to identify an object type that its associated pixel represents. These identified object types may include a graphical image, vector graphics, or text, for example. Object type tags may be one or more bits of such an attribute array.

Figure 5:
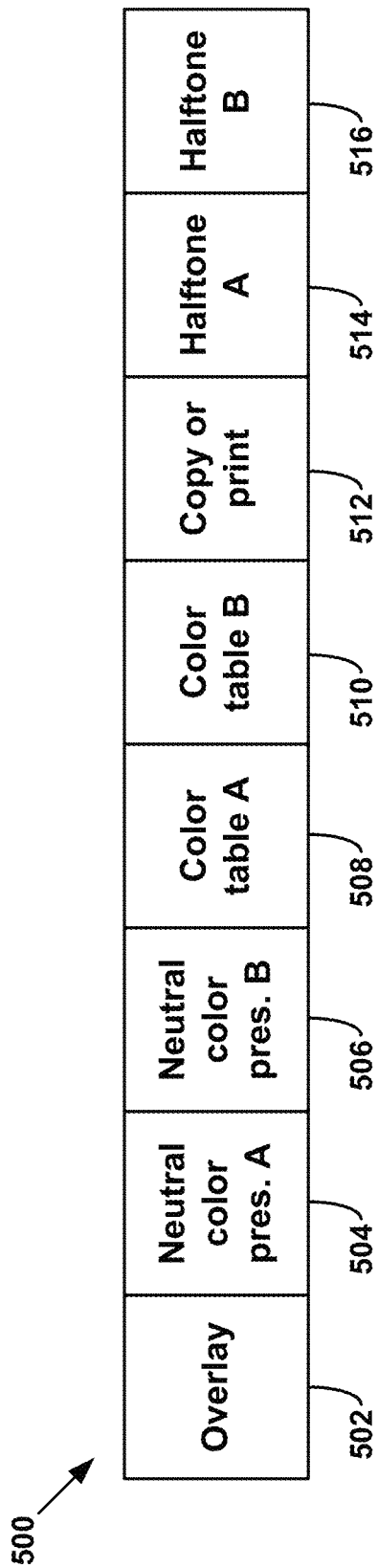
FIG. 5 depicts an attribute array, according to example embodiments.

An example attribute array 500 is shown in FIG. 5. Attribute array 500 includes overlay bit 502, two neutral color preservation bits 504, 506, two color table bits 508, 510, a copy or print bit 512, and two halftone bits 514, 516.

Overlay bit 502 may indicate whether the associated pixel overlays other materials. For instance, some printing devices may support applying one or more background images or patterns to some print jobs. These images or patterns may be static, such as a logo or a border, or may be dynamic, such as automatic page numbering (e.g., displaying a phrase such as "Page 1 of 3" at the bottom of each page in a document).

For instance, in the case of automatic page numbering, the printing device may be directed by a user to add page numbers. The user might select an option on the user interface of the printing device to specify automatic page numbering. Alternatively, the printer driver of the computer that transmits the electronic document to the printing device may specify automatic page numbering. In other cases, the printing device may detect which pixels are foreground pixels (such as text on a page) versus background pixels (such as the white background of a page), and indicate that the foreground pixels are overlaid.

Neutral color preservation bits 504, 506 may indicate whether a pixel is a "neutral" color, such as white, black, or gray, or a non-neutral color. For instance, neutral color preservation bits 504, 506 may take on a value of "00" for white, "01" for black, "10" for other neutral grays, or "11" for non-neutral colors.

Performing neutral color preservation may improve the color conversion process from the CMY color model to the CMYK color model, and/or the color conversion process between other color models. Printers may perform this conversion so that neutral colors can be expressed entirely using the K color channel, resulting in the use of only black toner. Thus, it is desirable for white pixels to remain white, black pixels to remain black, and gray pixels to be expressed in the CMYK color model as (0, 0, 0, K). However, the lossy compression and decompression techniques herein can result in neutral pixels being represented as non-neutral colors.

In the CMY color model, a color is a neutral gray when all three channels have the same value, and such a neutral color can be converted to the CMYK color model as (0, 0, 0, K). As an example, a gray CMY pixel (73, 73, 73) may be changed by a lossy compression/decompression technique to a non-gray pixel (73, 74, 72). Thus, the color neutrality of this pixel is lost, and color toner would be used to print this pixel. To overcome this drawback, neutral color preservation bits 504, 506 can be used to force the decompressed CMY pixel back to a neutral state. One possible way of doing this would be to take the average value of the C, M, and Y pixels, round that value off to the nearest integer, and use the resulting value for all three color channels.

Conversely, in some cases, the values of a pixel may indicate that it is neutral (e.g., the C, M, and Y pixels all have the same value), but the neutral color preservation bits may take on a value of "11". In this case, the least-significant bit of one of the color planes may be flipped (from 0 to 1 or from 1 to 0) in order to change the pixel into a non-neutral color.

Additionally, a CMY pixel that is pure white will take on the values (0, 0, 0), and the associated neutral color preservation bits may be "00". After compression and decompression, the pixels may take on non-pure-white values, such as (0, 2, 1). In this case, the neutral color preservation bits may be examined, and it may be determined the pixel should be pure white. Accordingly, the pixel's values may be changed to (0, 0, 0) to preserve its pure white characteristics.

Similarly, a CMY pixel that is pure black will take on the values (255, 255, 255), and the associated neutral color preservation bits may be "01". After compression and decompression, the pixels may take on non-pure-black values, such as (255, 253, 253). In this case, the neutral color preservation bits may be examined, and it may be determined the pixel should be pure black. Accordingly, the pixel's values may be changed to (255, 255, 255) to preserve its pure black characteristics.

Herein, pure white pixels with values of (0, 0, 0) and pure black pixels with values of (255, 255, 255) may be referred to as pixels with "pure extreme" values. In implementations where more than eight bits are used to represent color values, respective pixel values other than (0, 0, 0) and (255, 255, 255) may represent pure white and pure black.

Color table bits 508, 510 may indicate a color table that contains a mapping of color plane values between the CMY and CMYK color models, as one possible example. As noted above, the object type of a pixel (e.g., image graphics, vector graphics, or text) may be determined from the PDL representation of the electronic document from which the pixel is derived. Based on the object type of the pixel, a different color conversion table may be applied. For instance, color table bits 508, 510 may take on a value of "00" when the pixel is part of a text object, "01" when the pixel is part of a vector graphics object, and "11" when the pixel is part of an image graphics object. Based on the values of color table bits 508, 510, one of several color conversion tables may be selected and applied to the pixel.

Copy or print bit 512 may indicate whether the associated pixel is being copied (scanned and then printed) or traditionally printed (e.g., from a PDL document locally stored or received from another device). The value of this bit may be combined with those of halftone bits 514, 516 to select one of up to eight halftone screens (see below for a discussion of halftoning). In some cases, electronic documents that are scanned and then printed may use certain types of halftone screens, while electronic documents that are traditionally printed may use other types of halftone screens.

Halftone bits 514, 516 may indicate whether a halftone screen is to be applied to the image when printed, and which halftone screen is to be applied. Halftoning is a technique that simulates a gradient through the use of dots that vary in size, shape, or spacing. Halftoning can decompose images containing multiple shades of various colors into a series of overlaid halftone screens, with each screen containing a single (binary) shade of a particular color. The overlaid halftone screen creates an appearance that the dots are blended into smooth tones.

Similar to color table bits 508, 510, halftone bits 514, 516 may take on values based on the type of object that the pixel represents. Thus, halftone bits 514, 516 may take on a value of "00" when the pixel is part of an image graphics object, "01" when the pixel is part of a vector graphics object, and "11" when the pixel is part of a text object. Based on the values of halftone bits 514, 516 one of several halftone screens may be selected and applied to the pixel.

Although based on the same three object types, color table bits 508, 510 may be distinct from halftone bits 514, 516. One possible reason for keeping these two distinct sets of information is to accommodate object pixel overlap blending in some PDLs. For example, when text pixels are blended with raster image pixels, color table bits 508, 510 may indicate a raster image, halftone bits 514, 516 may indicate text. This feature upholds the image quality of overlapping, blended objects.

Example attribute array 500 contains 8 bits (1 byte) per pixel. Thus, using this style of attribute array, the magnitude of the attribute plane grows linearly with the number of pixels in the image. The extent of attribute arrays associated with pixels in an image may be referred to as the attribute plane for that image.

An attribute plane may be referred to as an A plane. Thus, when an attribute plane is combined with one or more color planes, the combined attribute and color planes may be referred to as KA, CMYA, CMYKA, RGBA, or YCbCrA, depending on color model being used. Herein, these examples of combined attribute and color planes may be referred to as a "color model" despite the attribute plane not actually representing a color per-se.

6. EXAMPLE IMAGING PIPELINE

Figure 6:
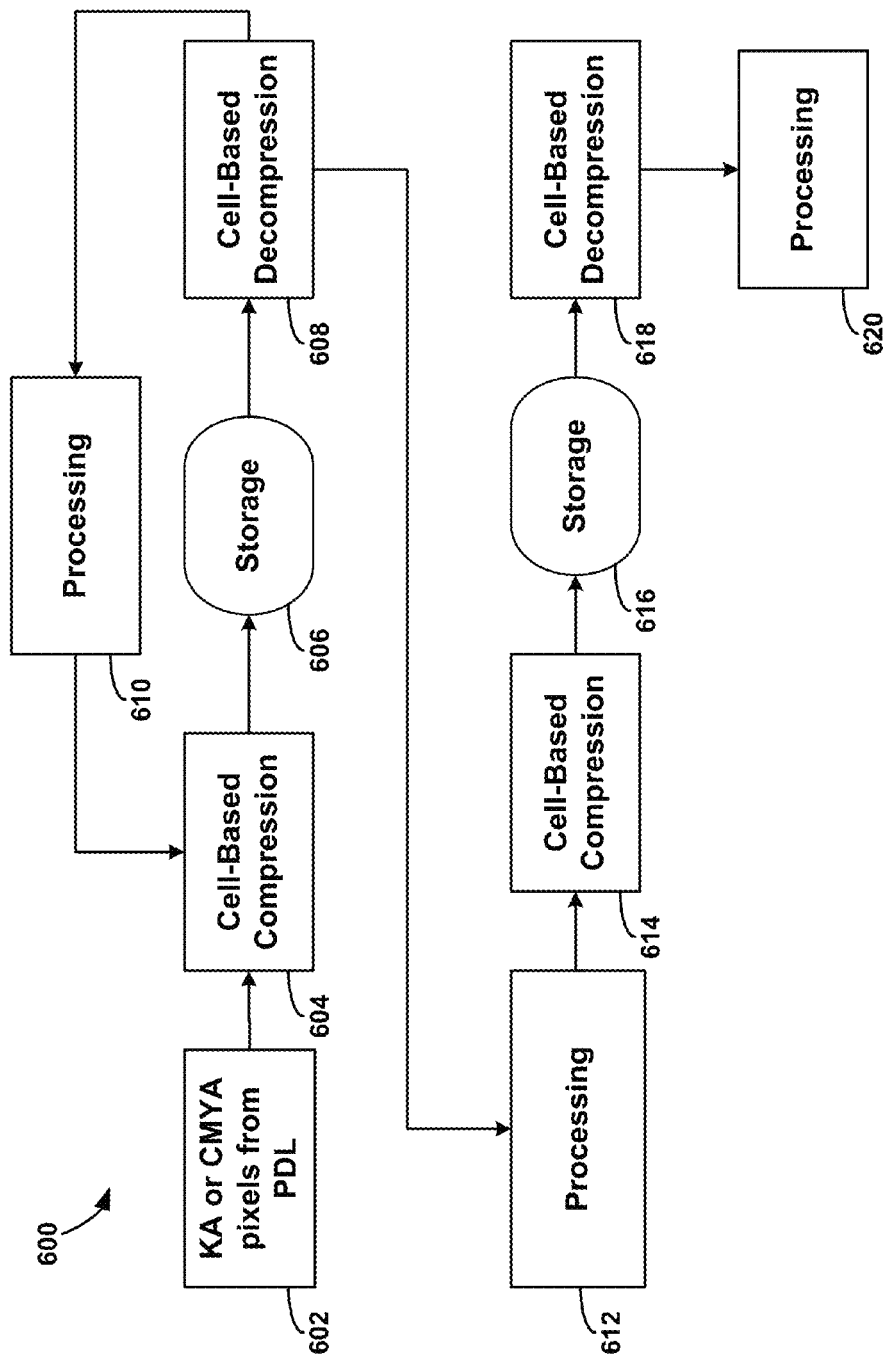
FIG. 6 depicts a document processing pipeline, according to example embodiments.

A high-level overview of an example imaging pipeline is shown in FIG. 6. This imaging pipeline takes the form of a flow chart 600, and includes multiple compression and decompression steps. Flow chart 600 may represent a series of steps carried out by a printing device in order to receive, store, and print an electronic document.

At block 602 of FIG. 6, an electronic document may be represented as one or more images formatted according to the KA or CMYA color models. However, these color models are chosen for purposes of illustration, and other color models may be used. The KA or CMYA pixels may be derived from a PDL representation of the electronic document.

Alternatively, at block 602, the electronic document may be represented by an image format, such as a bitmap, JPEG, GIF, etc., and converted to the KA or CMYA color model, for instance.

At block 604, cell-based compression (discussed in detail below) may be applied to the pixels of each plane of the electronic document. Thus, for KA electronic documents, cell-based compression may be applied to the gray plane and the attribute plane. For CMYA electronic documents, cell-based compression may be applied separately for each of the C, M, Y, and A planes or in a composite fashion. Therefore, in some cases, the cell-based compression may compress the corresponding cells of two or more planes in the same logical operation. The result of block 604 may be a bitstream representing a compressed version of the electronic document.

At block 606, this compressed version may be stored in a storage output medium. In general, this storage may be memory of a printing device that stores compressed representations of one or more pages. Since the compression techniques described herein may be able to compress these documents to at least one-third or one-fourth of their original bitmapped size, the memory size requirements for the storage may be reduced accordingly. As a result, printing devices incorporating the embodiments herein may be less expensive to produce.

At block 608, cell-based decompression may be applied to each plane of the electronic document. This may result in the re-creation of the KA or CMYA representation of the electronic document. However, if the cell-based compression technique uses lossy compression, the electronic document resulting from the decompression of block 608 may be different from the electronic document that was compressed by the compression of block 604. Nonetheless, the differences between these versions of the electronic document might be slight, and therefore might not be readily perceived by humans.

At block 610, the decompressed version of the electronic document may be further processed. For instance, various transforms may be applied to the electronic document. After one or more of these transforms are performed on the electronic document, the electronic document may be compressed again at block 604 and stored in storage at block 606. Application of block 610 is optional, and not all electronic documents will be subject to this processing.

At block 612, the decompressed version of the electronic document may also be further processed. At block 614, cell-based compression may be applied to each plane of the electronic document. This compression procedure may be the same as that of block 604, or may be different. For instance, the compression applied at block 614 may be configured to obtain higher or lower compression ratios than that of block 604.

At block 616, this compressed version may be stored in storage. Like the storage of block 606, this storage may be memory of a printing device that stores compressed representations of one or more pages. Since these page representations are compressed, the memory requirements and cost of storage is reduced.

At block 618, cell-based decompression may be applied to each plane of the electronic document. This may result in the re-creation of the KA, CMYA, or CMYKA representation of the electronic document. As was the case for block 608, if the cell-based compression technique uses lossy compression, the electronic document resulting from the decompression of block 618 may be different from the versions of the electronic document that were compressed by the compression of block 604 and/or block 614.

At block 620, further processing may be applied to the electronic document. After block 620, the electronic document may be ready for printing, or additional processing may be applied.

The cell-based compression procedures of blocks 604 and 614 may be the same or different. For instance, these procedures may use different compression algorithms, or may use the same compression algorithm with the same or different settings. Likewise, the cell-based decompression procedures of blocks 608 and 618 may also be the same or different.

In some embodiments, the number of attribute plane bits used per pixel may vary based on the point at which compression takes place in flow chart 600. For instance, all bits of attribute array 500 may be compressed at block 604. Since color conversion, neutral color preservation, overlay processing, and halftoning may take place after block 604, each bit in attribute array 500 should be preserved.

However, after step 612, overlay bit 502, neutral color preservation bits 504, 506, and color table bits 508, 510 may no longer be needed. Further, some types of printing devices do not have a copy function. Thus, for these printing devices, copy or print bit 512 might not be used any point in flow chart 600, and can be omitted from the compression of block 604 and block 614.

Regardless, in various embodiments, anywhere from zero to six bits of attribute array 500 may be omitted from a cell-based compression procedure. As a result, the overall number of bits that are compressed per cell may be reduced, which may in turn improve the achievable compression ratio of cells of the attribute plane.

The description herein focuses on a single instance of cell-based compression applied to the attribute and color planes of an image. The image may be a representation of a single page from an electronic document containing one or more pages. Nonetheless, multiple instances of this cell-based compression may be applied to the cell of such an image, according to pipeline 600 or some other arrangement. In this way the entire image may be compressed in an efficient fashion.

Further, cell-based decompression techniques may also be applied to the image by reversing the cell-based compression techniques described herein.

7. EXAMPLE CELL CONFIGURATION

One aspect of cell-based compression is that it may divide each color plane and attribute plane of an electronic document into one or more m×n cells, and then compress each cell in a partially-independent or fully independent fashion. For example, m might be 8 and n might be 4. Alternatively, m might be 8 and n might be 8, or m might be 16 and n might be 16, as well. Other values of m and n may be used.

Each cell may be evaluated to determine what type of compression techniques might be most efficient for compressing the data in that cell. For example, if a cell consists entirely of pixels that are the same color, the data in the cell may be very efficiently compressed into a representation of the color and perhaps some overhead data. However, if a cell contains part of a photorealistic image, the data in the cell may not be able to be compressed at such a high compression ratio.

Figure 7:
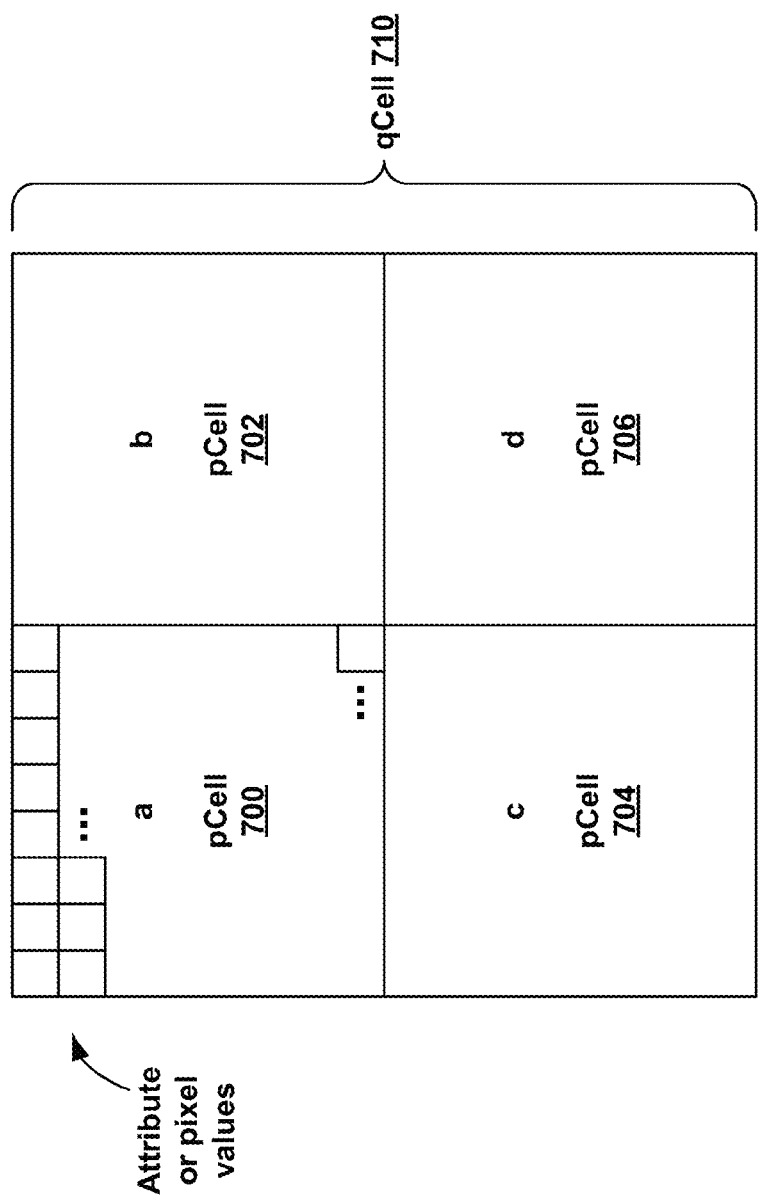
FIG. 7 depicts a macro-cell containing four cells, according to example embodiments.

FIG. 7 depicts an example cell structure that can be used with cell-based compression. For sake of convenience, cells are considered in terms of pCells and qCells. pCells may be m×n element blocks of a color plane or attribute plane of an image. Thus, for a color plane, pCell elements may be pixels, while for an attribute plane, pCell elements may be attribute arrays. qCells may be a×b element blocks of a color plane or attribute plane of an image. Each qCell may consist of some number of non-overlapping pCells. Depending on context, the terms "pCell" and "qCell" could refer to the elements of a single attribute or color plane or multiple attribute and color planes.

As an example, FIG. 7 depicts four 8×8 pCells 700, 702, 704, 706 each containing 64 attribute or pixel values for a particular plane. Each attribute or pixel value, for example, may be represented by a number in the range of 0-255, and thus may be expressed as a byte. However, other possibilities exist. For sake of simplicity, pCell 700 only shows the positions of some representative values.

A 2×2 arrangement of four pCells as shown in FIG. 7 may be referred to as a qCell. Thus, the qCell 710 of FIG. 7 may be 16×16, and may contain 256 attribute or pixel values for a particular plane. Nonetheless, a qCell could include a different number of pCells (e.g., a 3×2, 2×3, or 3×3 block of pCells).

FIG. 7 refers to the upper-left-hand pCell as the "a" pCell, the upper-right-hand pCell as the "b" pCell, the lower-left-hand pCell as the "c" pCell, and the lower-right-hand pCell as the "d" pCell. These designations may be referred to as pCell IDs, and are merely a convenient way to distinguish the locations of pCells within a qCell, and will be used in the interleaving discussion below.

The cell-based compression techniques described herein may operate on pCells and qCells. For purposes of simplicity, it will be assumed that 8×8 pCells and 16×16 qCells are used. However, this assumption is made with the understanding that differently sized pCells and qCells may be used instead.

Further, a planar pCell or qCell may refer to elements of a single plane, while a composite pCell or qCell may refer to corresponding elements across multiple planes. For instance, when the CMYA color model is used, a planar pCell may include elements of one of the C, M, Y, or A planes, while a composite pCell may include elements from two or more of the C, M, Y, and A planes.

8. EXAMPLE CELL-BASED COMPRESSION

TABLE 1

| Compression | Cell Type | Lossy or Lossless | Color Plane Usage | Attribute Plane Usage |
|---|---|---|---|---|
| D1, D1D | pCell | Lossless | Yes | Yes |
| P2, P2D | pCell | Lossless | Yes | Yes |
| P4 | pCell | Lossless | Yes | Yes |
| DCTP | pCell | Lossy | Yes | No |
| DCTQ | qCell | Lossy | Yes | No |
| D1C | qCell | Lossless | Yes | Yes |
| D1E | N/A | N/A | Yes | Yes |
| D64 | pCell | Lossless | No | Yes |
| EOF | N/A | N/A | Yes | Yes |

The next several sub-sections describe various cell-based compression techniques in detail. Each of these techniques operates with pCells, qCells, or both. An overview of these compression techniques is provided in Table 1.

a. D1 and D1D Compression

D1 compression may be used when all of the attributes or pixels in a given pCell are the same. For instance, suppose that each attribute or pixel in the pCell takes on a value from 0 to 255. If all of the values are 74, as just one example, then D1 compression may be applied to this cell. In this way, the amount of data needed to represent the pCell can be dramatically reduced.

A variation of D1 compression, which may be referred to as D1D compression, may be used when the color value is a default color. For instance, in the YCbCr color space's Y plane, the gray color space, and all CMYK color spaces, the default values may be 0 and 255. In the YCbCr color space's Cb and Cr planes, the default values may be 128 and 255. D1D compression has a somewhat more efficient encoding than D1 compression. As there are only a limited number of default values (e.g., 2) in a color space, these default color values can be represented with a small number of bits (e.g., 1). Consequently, D1D compression may require fewer bits per pCell than D1 compression.

For the attribute plane, the D1D default value may be predetermined (e.g., 0 or 128) or set manually by a user.

In some cases, multiple adjacent pCells (e.g., pCells in a row or column) with same value for all attributes or pixels may be represented using D1 or D1D encoding. There are two possible ways in which this may occur. Both D1 and D1D compression allow for a run length to be encoded. The run length represents how many total pCells were also compressed using D1 compression. D1 compression also allows a previously used (cached attribute or pixel value) to be used in the encoding of a subsequent pCell.

TABLE 2

| Compression | Opcode | Options | Arguments |
|---|---|---|---|
| D1 | 001 | V' | Length/Value (opt) |
| D1D | 000 | V | Length |

Table 2 provides example binary encodings for D1 and D1D compression. For D1 compression, a compressed representation of a pCell begins with the opcode 001. If the V' bit is 1, the D1 encoding also includes the 1-byte value argument (which is the same for all attributes or pixels in the pCell). If the V' bit is 0, the value argument is omitted from the encoding, and the value in the most recent D1 encoding (e.g., a cached value) is used for all attributes or pixels in the pCell. The length argument may be two bits, thus supporting a run length within a qCell from 1 to 4 pCells. The value argument applies to pixel values as well as attribute values. Therefore, the value argument may be 8 bits when compressing a pCell of the color plane. As noted above, however, less than 8 bits may be used to represent attribute plane values, and the size of the value field may be decreased appropriately.

For D1D compression, a compressed representation of a pCell begins with the opcode 000. The V bit indicates which of the two default values is to be used (e.g., if V is 0, then one value will be used, and if V is 1, then the other value will be used). The length argument may be used in the same fashion as it is used for D1 compression.

b. P2 and P2D Compression

P2 compression may be used when each of the attributes or pixels in a given pCell can be represented using one of two values. For instance, if the attributes or pixels in a cell can take on values between 0 and 255, but all values are either 76 or 125, P2 compression may be used on the pCell. When P2 compression is used, the two values, as well as a bitmap of the attributes or pixels in the pCell, may be encoded. The bitmap indicates which value is associated with each attribute or pixel in the pCell. Similar to D1 and D1D compression, P2 compression may use caching of the most recently used pair of values.

A variation of the P2 compression technique, which may be referred to as P2D compression, may be used when only two default color values appear in a cell. As noted above, in the YCbCr color space's Y plane, the gray color space, and all CMYK color spaces, the default values may be 0 and 255. In the YCbCr color space's Cb and Cr planes, the default values may be 128 and 255. Thus, P2D compression may encode the bitmap of the attributes or pixels in the pCell, but does not need to explicitly encode the values of the attributes or pixels, because the default values are used.

For the attribute plane, one or both P2D default values may be predetermined (e.g., 0 and 128) or set manually by a user.

TABLE 3

| Compression | Opcode | Options | Arguments | Bitmap |
|---|---|---|---|---|
| P2 | 011 | V'/P | Line map (opt)/value 1 (opt)/value 2 (opt) | Up to 8 lines (opt) |
| P2D | 010 | P | Line map (opt) | Up to 8 lines (opt) |

Table 3 provides example binary encodings for P2 and P2D compression. For P2 compression, a compressed representation of a pCell begins with the opcode 011. If the V' bit is 1, the P2 encoding also includes the 2 bytes indicating the pair of values (value 1 and value 2) used by the attributes or pixels in the pCell. If the V' bit is 0, these values are omitted from the encoding, and the values in the most recent P2 encoding (e.g., the cached values) are used for the attributes or pixels in the pCell.

For P2D compression, a compressed representation of a pCell begins with the opcode 010. For both P2 and P2D compression, when the P option is 1, the line map argument is present, indicating which of the 8 lines in the bitmap are also present. When the P option is 0, no line map argument or lines in the bitmap are present. Instead, a cached bitmap from the most recent pCell compressed with P2 or P2D may be used.

Each bit of a line map indicates the presence of a corresponding line field in the bitmap. If the line map is present, then it may be assumed that at least one line is also present in the bitmap. Therefore, the line map might only use 7 bits to encode the 2nd through 8th line in the bitmap. For each bit of the line map a 0 indicates that the corresponding line absent, and the previous line repeats, while a 1 indicates that the corresponding line is present.

c. P4 Compression

P4 compression may be used when all of the pixels in a given cell can be represented using three or four color values. When P4 compression is used, three or four values, as well as a bitmap of the attributes or pixels in the pCell, may be encoded. The bitmap indicates which value is associated with each attribute or pixel in the pCell.

TABLE 4

| Compression | Opcode | Arguments | Bitmap |
|---|---|---|---|
| P4 | 100 | Line map/value 1/ value 2/value 3/value 4 | 1 to 8 lines |

Table 4 provides an example binary encoding for P4 compression. For P4 compression, a compressed representation of a pCell begins with the opcode 100. The 7-bit line map defines how the bitmap is compressed, similar to that of a P2 bitmap. For each bit of the line map, a 0 indicates that the corresponding line is absent, and the previous line repeats, while a 1 indicates that the corresponding line is present.

The four value arguments are 8-bit fields representing the values of elements found in the pCell. In order to distinguish between these values, each line of the bitmap (if present) may be 16 bits long. When only three values are encoded by P4 compression, the "value 4" argument may be present but ignored.

d. DCTP Compression

DCTP compression refers to using discrete cosine transform (DCT) techniques to compress a pCell. In some embodiments, DCTP compression may be used when D1, D1D, P2, P2D, and P4 compression are inappropriate for a particular pCell of a color plane. DCTP compression might not be used on the attribute plane because DCTP compression is lossy, and it is desirable for the attribute plane to be losslessly compressed. DCTP compression may involve: a DCT transform, scaling, quantization, reordering from a two-dimensional coefficient array to one-dimensional data, and Huffman entropy coding.

TABLE 5

| Compression | Opcode | Bitmap |
|---|---|---|
| DCTP | 11 | DCT encoding (6-200 bits on average) |

Table 5 provides an example binary encoding for DCTP compression. For DCTP compression, a compressed representation of a pCell begins with the opcode 11, and the remaining part of the representation is a DCT encoding. In some embodiments, the DCT encoding may be a collection of quantized DCT coefficients packaged according to a subset of the Joint Picture Experts Group (JPEG) standard, with Huffman encoding.

e. DCTQ Compression

DCTQ compression refers to using DCT techniques to compress a qCell as a whole by downsampling it to the size of a pCell, and then applying DCTP encoding to the resulting pCell. In some embodiments, DCTQ compression may be used when D1, D1D, P2, P2D, and P4 compression are inappropriate for one or more particular pCells of a color plane. DCTQ compression might not be used on the attribute plane because DCT-based compression is lossy, and it is desirable for the attribute plane to be losslessly compressed.

As an example, a 16×16 qCell may be downsampled to an 8×8 pCell. The downsampling procedure may involve dividing the 16×16 qCell into 64 non-overlapping 2×2 blocks, and replacing each block with a single pixel value that is the average of the pixel values in the respective block. The resulting 64 average values make up the 8×8 cell. Notably, this downsampling provides an initial 4:1 compression ratio, and then DCTP encoding provides additional compression on top of that.

TABLE 6

| Compression | Opcode | Bitmap |
| --- | --- | --- |
| DCTQ | 101 | DCT encoding (6-200 bits on average) |

Table 6 provides an example binary encoding for DCTQ compression. For DCTQ compression, a compressed representation of a qCell begins with the opcode 101, and the remaining part of the representation is a DCT encoding. Similar to the DCTP case, the DCT encoding may be a collection of quantized DCT coefficients packaged according to a subset of the JPEG standard, with Huffman encoding.

f. D1C and D1E Compression

D1C and D1E compression facilitate efficient encoding of runs of consecutive cells that are candidates for D1 or D1D compression. Encoding these runs may dramatically increase compression performance on images with sections exhibiting a solid color (e.g., a white background). Two types of D1 or D1D runs may be supported: (i) inter-qCell runs of D1 or D1D candidate pCells that cross qCells, and (ii) intra-qCell runs of D1 or D1D candidate pCells within a qCell.

Inter-qCell D1 or D1D runs encode D1 or D1D runs that span two or more qCells. When the two right most pCells (the "b" and "d" pCells) in a qCell contain an 8×16 array of constant pixel values that get encoded using D1 compression, this implies the start of a D1 or D1D run, and causes the encoding mode to change from a normal encoding mode to D1 or D1D run encoding mode. This encoding mode is tracked per plane, and on qCell boundaries. Thus, for a particular plane, the mode change to D1 or D1D run encoding mode takes place at the end of a qCell boundary.

In D1 or D1D run encoding mode, only two codes are defined: D1C (continue) and D1E (end), and they are each encoded using a single bit. As long as subsequent qCells contain the same 16×16 pixel value as the two D1 or D1D candidate pCells that began the run, a 1-bit D1C opcode is emitted, and D1 or D1D run encoding mode continues. If a subsequent qCell contains anything other than a solid value matching the start of the run, then the run ends. In this case, a 1-bit D1E code is emitted and normal encoding mode is reentered. Also, any remaining D1, P2, P4, DCTP or DCTQ encodings for the present qCell are emitted.

Intra-qCell D1 or D1D runs encode D1 or D1D runs within a qCell. For instance, a 2-bit run length may be used to encode D1 and D1D runs that extend from 1 to 4 pCells within a qCell. Such runs are denoted D1(n) and D1D(n), where n takes on values 1, 2, 3, or 4.

TABLE 7

| Compression | Opcode |
| --- | --- |
| D1C | 1 |
| D1E | 0 |

Table 7 provides example binary encodings for D1C and D1E compression. For D1C compression, a 1 indicates a continuation of a D1 or D1D run, and all four pCells in the given qCell match the D1 or D1D cells of the current run. For D1E compression, a 0 indicates the end of a D1 or D1D run.

g. D64 Compression

D64 compression is a lossless technique that is used to encode a pCell of the attribute plane for which D1, D1D, P2, P2D, and P4 compression is not appropriate. For instance, if the pCell contains 5 or more different values, D64 compression may be used.

D64 compression encodes all 64 values of an 8×8 attribute pCell, and when included with its header, the results in a very small expansion rather than a compression. However, since it is desirable for the attribute plane to be compressed in a lossless fashion, D64 compression may be necessary in some situations.

Nonetheless, depending of where the cell-based compression is taking place in compression pipeline 600, all 8 bits of the attribute values in a pCell might not be encoded. Instead, 2-8 bits of these values may instead be packed and encoded. This results in an improvement for D64 compression.

TABLE 8

| Compression | Opcode | Attributes |
| --- | --- | --- |
| D64 | 11 | 64 attributes encoded using 2-8 bits per attribute |

Table 8 provides an example binary encoding for D64 compression. A compressed representation of a D64 pCell begins with the opcode 11, and also includes the 64 attribute arrays in the pCell, encoded using 2-8 bits per attribute. The number of bits per attribute array is based on how many attribute bits can be omitted when compressing the attribute plane, as discussed above. Note that DCTP and D64 compression share the same opcode. However, since DCTP is used only for color planes and D64 is used only for attribute planes, these encodings can be differentiated based on the plane of the pCell being compressed.

h. End of File (EOF)

An EOF is not a compression technique per-se, but instead is defined to signal the end of a compression stream. At a compressor, after all input data has been compressed and the last codes of the last qCell have been emitted, an EOF sequence can be emitted. The EOF is emitted as an attribute plane code.

If the attribute plane is in D1 or D1D run encoding mode, a D1E may be emitted to return to normal encoding mode before the EOF is emitted. Additionally, an EOF automatically terminates any active inter-qCell D1 or D1D runs on any plane other than the attribute plane.

TABLE 9

| Compression | Opcode | Value |
| --- | --- | --- |
| EOF | 001 | 1 00 0000 0000 |

Table 9 provides an example binary encoding for an EOF. After an opcode of 001, the binary value "10000000000" is emitted. Since the EOF shares an opcode with D1 compression, this value can be used to differentiate an EOF from a D1 encoding of a pCell.

9. EXAMPLE DECISION TREES

The encoding of pCells and qCells may be based on one or more decision trees. Each decision tree illustrates a process through which various factors are considered before a pCell or qCell is encoded. There may be separate decision trees for attribute planes and color planes. For instance, it is desirable to not lose any information when compressing an attribute plane. Therefore, attribute planes may be compressed using various lossless compression techniques. On the other hand, it is desirable to compress some portions of color planes (e.g., vector graphics and text portions) in a lossless fashion, but compress other portions of color planes (e.g., image graphics portions) in a lossy fashion. In this way, details in the original image can be preserved when desired, but high compression ratios can still be achieved.

a. Color Plane Decision Tree

Figure 8:
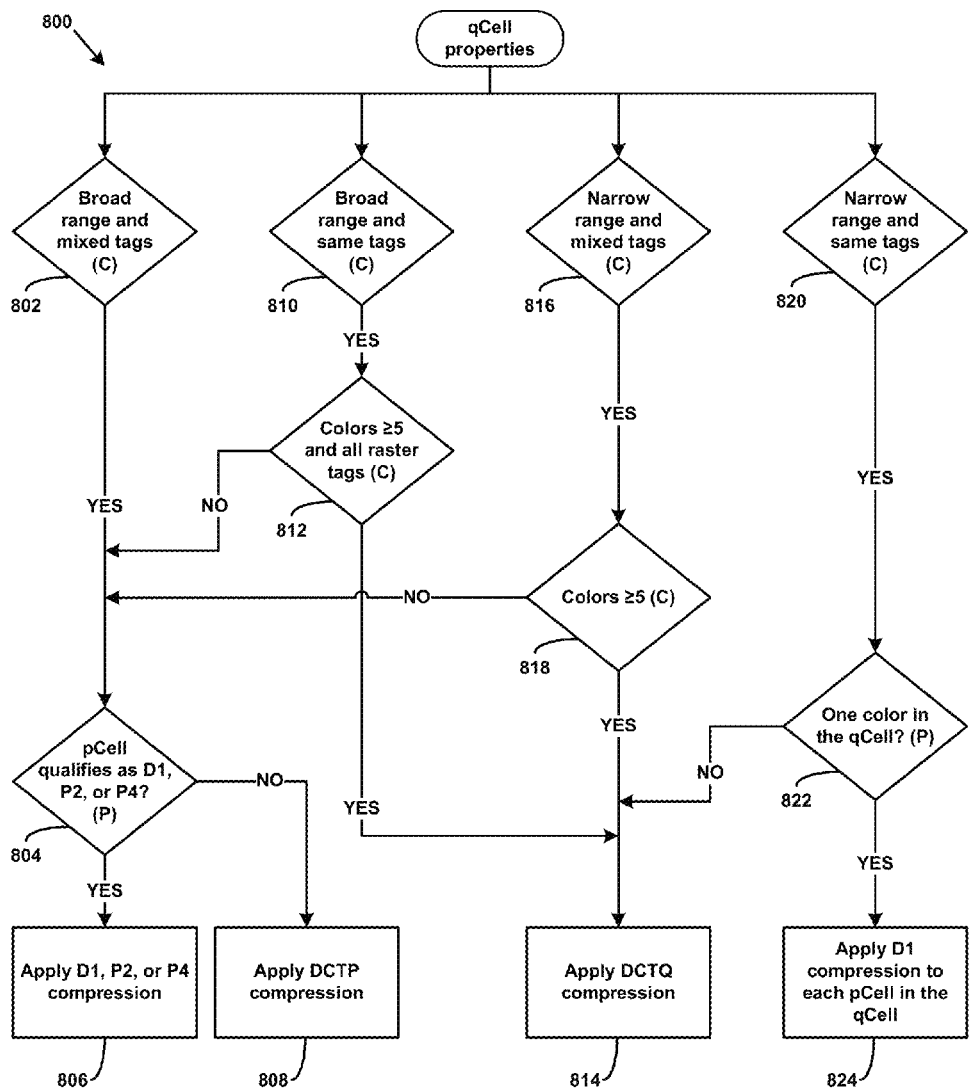
FIG. 8 depicts a color plane decision tree, according to example embodiments.

FIG. 8 depicts a color plane decision tree 800, in accordance with example embodiments. This decision tree considers the properties of a qCell, with the understanding that a qCell consists of four non-overlapping pCells. The sizes of such a qCell and its subsidiary pCells may be 16×16 and 8×8, respectively. However, other sizes may be used instead.

It is assumed that the each pixel in the qCell is tagged with an indication of the type of object of which the pixel is part—e.g., text, vector (e.g., line art), or raster (e.g., image). These tags may reside in the attribute plane for the qCell.

Further, decision tree 800 may be used for 1200 dpi and/or 600 dpi images. However, in some cases, when processing 600 dpi images, the DCTQ method may be omitted in order to avoid downsampling to 300 dpi. For instance, the decision tree for 600 dpi images may include only blocks 804, 806, and 808 of FIG. 8.

In each decision block 802, 804, 810, 812, 816, 818, 820, 822, the type of decision is indicated parenthetically. If the decision is made on a planar basis, a parenthetical P is present. If the decision is made on a composite basis, a parenthetical C is present. However, each of the compression techniques is applied per plane.

Planar decisions are made by considering the qCells and/or pCells of each color plane separately. Thus, for instance, a planar decision may consider the color properties and/or attributes associated with a single qCell and/or pCell. However, a composite decision may consider the qCell and pCell properties and associated attributes for all color planes in a location in the image defined by the qCell.

For purposes of simplicity, D1D and P2D compression are not referenced explicitly in decision tree 800. However, wherever D1 or P2 compression are considered or used, D1D and P2D compression may be considered or used as well. Thus, blocks 804 and 806 may consider and use D1D and P2D compression, while block 824 may apply D1D compression. Runs of consecutive D1 or D1D encodings are also not explicitly considered in decision tree 800, but may be used regardless.

Blocks 802, 810, 816, and 820 each represent composite decisions made on the basis of a qCell. For each of these decisions, the ranges of values on all color planes of the qCell are considered, as is the number of object types represented by the qCell. To determine whether the range is broad or narrow, the range of values for each plane may be determined (thus, for instance, if there are three color planes, three ranges are determined). Each range may be calculated by taking the difference of the highest pixel value in the qCell for that plane, and subtracting the lowest pixel value in the qCell for that plane. If any of these ranges exceeds a predetermined threshold, the range is classified as broad. Otherwise, the range is classified as narrow. The predetermined threshold may be 4, 8, 16, 32, or some other value.

Further, a mix of tags indicates that two or more objects meet in a qCell, and therefore the qCell may contain an edge. It is desirable to preserve edges, in order to maintain the sharpness of the image. If all 256 tag values of a qCell are the same, then it is unlikely that there is an edge in the qCell.

A broad range indicates detail worth preserving, while a narrow range indicates a good qCell candidate for downsampling. A broad range and mixed tags, taken together, may be evidence of a qCell with an edge. In this case, and as reflected by block 802, downsampling should be avoided. When the inquiry of block 802 is answered in the affirmative, block 804 is considered next.

At block 804, the qCells may have edge detail to preserve, so each plane is encoded pCell-by-pCell to best preserve this detail. A pCell qualifies for encoding as a D1, P2, or P4 if it has 1, 2, or 4 colors, respectively. If one of D1, P2, or P4 compression is selected, this technique may be applied at block 806. Otherwise DCTP compression may be applied at block 808. In some embodiments, block 804 may involve the general process of determining whether the respective color values of the m×n pixels of each pCell of each color plane include at least d colors, where d is at least 2.

On the other hand, if the qCell exhibits a broad range and the same tag throughout, then the inquiry of block 810 is answered in the affirmative, and block 812 is considered next. On a composite basis, it is determined whether there are 5 or more colors in the qCell, and all of the tags indicate a raster. If this condition is true, then the qCell contains only image data, and may be compressed using the DCTQ technique at block 814. If this condition is not true, the qCell either contains text or line art that should not be downsampled, or contains image data with a very small number of values. In either case, D1, P2, P4, or DCTP compression may either be better at preserving the information in the qCell, or may provide a better compression ratio. Thus, the qCell may be considered further at block 804, and compressed at either block 806 or block 808.

Alternatively, if the qCell exhibits a narrow range and mixed tags, the qCell may be a candidate for downsampling, because little information should be lost in this process. However, if there are 4 or fewer colors in the qCell, one of D1, P2, or P4 compression may provide a better compression ratio than DCT-based compression.

Accordingly, if the inquiry of block 816 is answered in the affirmative, block 818 is reached. At block 818, it is determined, on a composite basis, whether the qCell contains 5 or more colors. If so, then the qCell is likely to contain mostly image data, and may be compressed using the DCTQ technique at block 814. If not, the qCell may be considered further at block 804, and compressed at block 806. Since the qCell has 4 or fewer colors, one of D1, P2, or P4 compression will be applicable, and block 808 might not be reached in this scenario.

If a qCell exhibits a narrow range the same tag throughout, this is strong evidence of no edge in the qCell. If the inquiry of block 820 is answered in the affirmative, block 822 may be considered next. At block 822, it may be determined whether all pixels in each plane of the qCell have the same value. If so, using D1 compression will be more efficient than DCT-based compression. Accordingly, the plane of the qCell may be compressed, on a pCell-by-pCell basis, at block 824. Otherwise, DCTQ is applied to the plane of the qCell at block 814.

FIG. 8 depicts one possible color plane decision tree. Other such decision trees are possible. For instance, when compressing a 600 dpi image, only blocks 804, 806, and 808 might be used.

b. Attribute Plane Decision Tree

Figure 9:
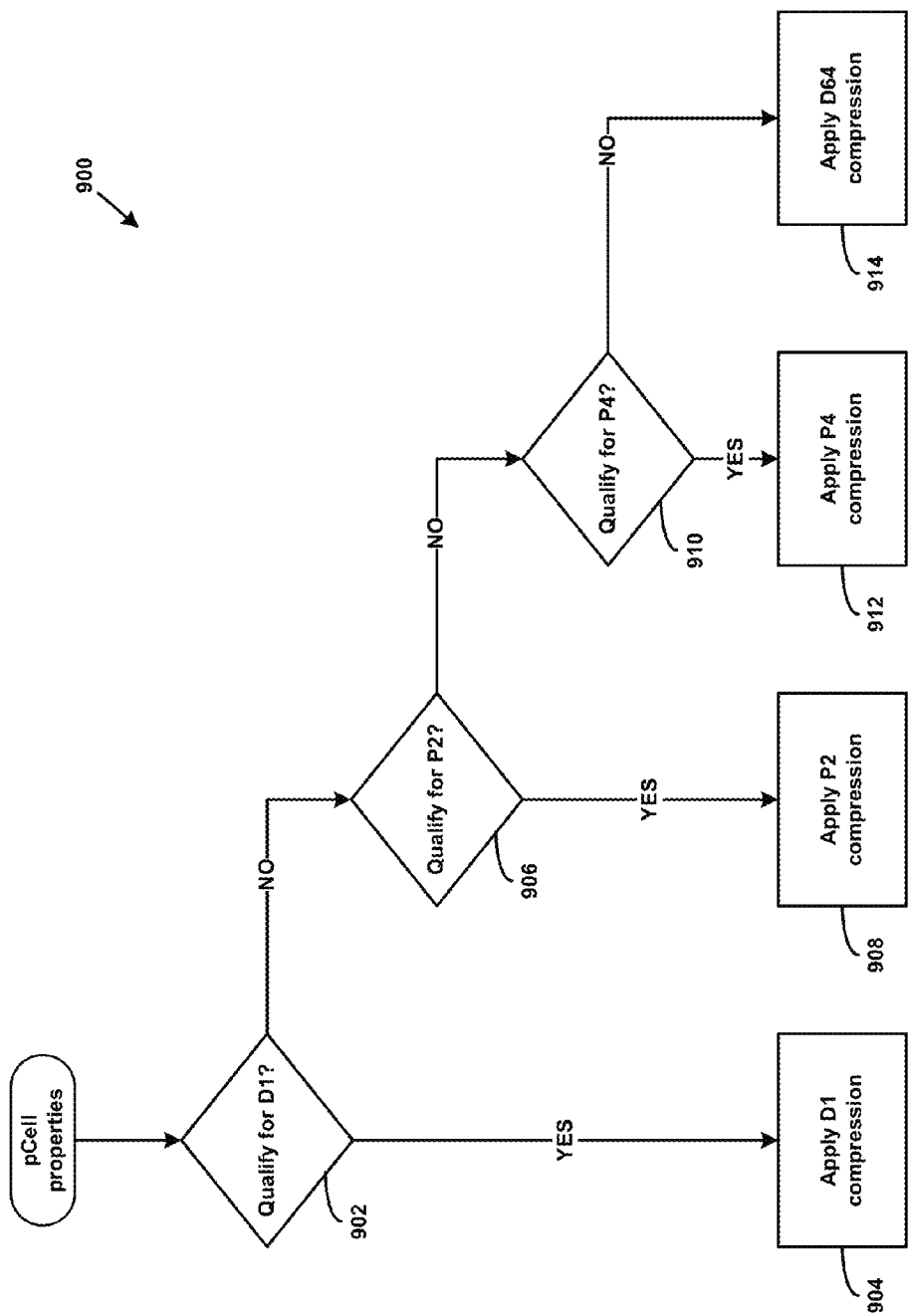
FIG. 9 depicts an attribute plane decision tree, according to example embodiments.

FIG. 9 depicts an attribute plane decision tree 900, in accordance with example embodiments. This decision tree considers the properties of a pCell of an attribute plane, with that understanding that each element of this attribute plane pCell is associated in a one-to-one fashion with a pixel values of one or more corresponding color plane pCells. The size of these pCells may be 8×8, but other sizes may be used instead. It is also assumed that there is only one attribute plane, so all decisions in decision tree 900 are made on a planar basis. However, alternative embodiments could take different approaches.

Similar to decision tree 800, D1D and P2D compression are not referenced explicitly in decision tree 900. However, wherever D1 or P2 compression is considered or used, D1D and P2D compression may be considered or used as well. Thus, blocks 902, 904, 906, and 908 may consider and/or use D1D and P2D compression. Runs of consecutive D1 or D1D encodings are also not explicitly considered in decision tree 900, but may be used regardless.

At block 902, it is determined whether the attribute plane pCell qualifies for D1 compression. If so, D1 compression is applied at block 904. Otherwise, at block 906, it is determined whether the pCell qualifies for P2 compression. If so, P2 compression may be applied at block 908.

If the pCell does not qualify for either D1 or P2 compression, at block 910 it may be determined whether the pCell qualifies for P4 compression. If so, P4 compression may be applied at block 912. Otherwise, D64 compression may be applied at block 914.

FIG. 9 depicts one possible attribute plane decision tree. Other such decision trees are possible.

c. Fallback Mode

In some cases, the behavior of a printing device's pipeline, such as the pipeline of FIG. 6, may be dynamically modified based on various performance goals. In particular, a printing device can be configured to enter a fallback mode when either its compression ratio or its decompression speed is not meeting pre-established thresholds.

Compression size may be a goal because, as discussed above, the storage of block 616 may be designed to store a small number of pages (e.g., two 1200 dpi A3 CMYKA pages). Decompression speed may also be a goal because the cell-based decompression of block 618 should not operate more slowly that the printing device can print the decompressed data.

Accordingly, the printing device may be configured to detect compression buffer overflow, and/or decompression speed underruns. A compression buffer overflow occurs when the number of bytes written to memory (e.g., storage of block 616) exceeds a predetermined threshold, indicating that the achieved compression ratio is poor. A decompression speed underrun occurs when the number of DCT encodings qCell per part or all of a page exceeds a predetermined threshold.

After detecting a compression buffer overflow, the decision trees of FIGS. 8 and/or 9 may be modified so that compression techniques that always achieve at least 4:1 compression are used. For instance, on the color planes, the use of P4 compression may be eliminated and replaced with DCTQ compression for a pCell that would normally be encoded with P4 compression, as well as the remaining pCells in the same qCell. In a similar fashion, DCTP compression may also be replaced by DCTQ compression. On the attribute plane, P4 compression may be replaced with D64 compression when only 1 or 2 bits per attribute element are maintained.

After detecting a decompression speed underrun, the color plane decision tree of FIG. 8 may be modified to force no more than t DCT operations qCell, where t is 1, 2, or 3.

10. INTERLEAVED ENCODING

The encoded output of cell-based compression may be interleaved. In some cases, an interleaved encoding may be superior to a non-interleaved encoding.

This interleaving may consider (i) the ordering of pCells and planes across qCells, (ii) whether downsampling is a planar or composite decision, and (iii) compression performance. For the latter consideration, separate DCT compression and pattern (non-DCT) compression processors may be used. It is assumed that the DCT compression processor will run in parallel with the pattern processor, and that the DCT processor may run much slower, perhaps at one-eighth the speed of the pattern processor. Thus, the interleave format may support maintaining high utilization of the DCT processor in various mixes of DCT and pattern pCells.

Based on these considerations, the qCells and pCells of the attribute plane and color planes may be written to an output medium (e.g., storage of block 606 and/or storage of block 616) in an interleaved fashion. As an example, if the color model is CMYA, then the ordering of encoded pCells may be an attribute pCell, then a cyan pCell, then a magenta pCell, then a yellow pCell, then another attribute pCell, then another cyan pCell, then another magenta pCell, then another yellow pCell, and so on.

A pseudo-code representation 1000 of such an operation is shown in FIG. 10. At line 1 of pseudo-code representation 1000, each composite (multi-planar) qCell in an input image is considered. At line 3, the composite qCell is sorted in planar order so that the attribute plane is first, the cyan plane is second, the magenta plane is third, the yellow plane is fourth, and the K plane (if present) is fifth.

At lines 4 and 5, each plane of each pCell is considered. At line 7, it is determined whether the planar qCell should be subsampled (downsampled). If, so, then at lines 8-11, a single pCell for the entire planar qCell is encoded and emitted (e.g. written to the output medium). If the planar qCell is not to be downsampled, then at line 13, each of its planar pCells (encoded using a non-DCT technique) are emitted.

Figures 11A, 11B:
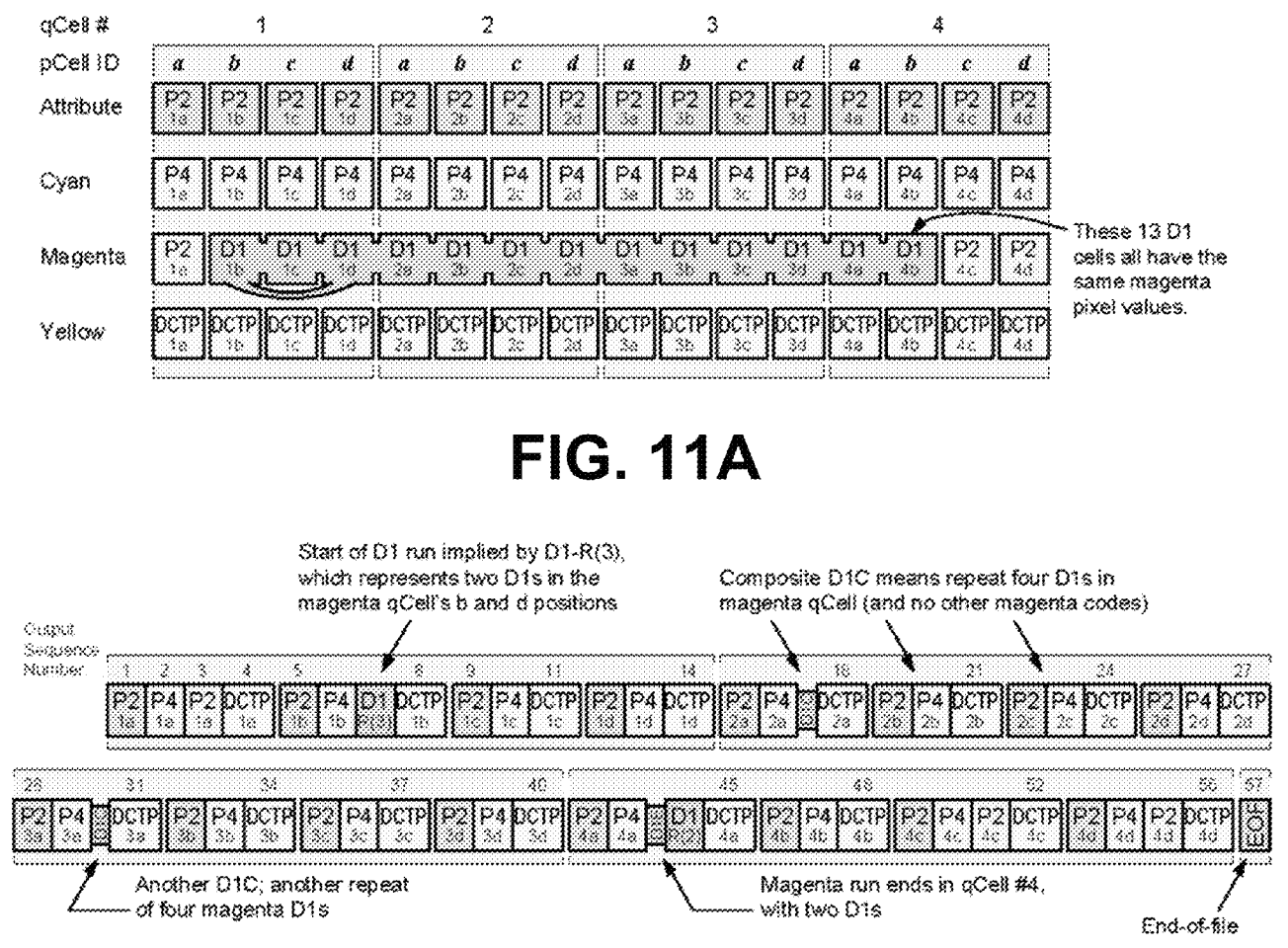

An example of such an interleaving operation is shown in FIGS. 11A and 11B. FIG. 11A depicts a series of four qCells for each of the attribute, cyan, magenta, and yellow planes. Each pCell within a qCell is associated with a respective pCell ID (e.g., a, b, c, or d), and depicted as a box. The boxes contain the compression technique used to compress each respective pCell, as well as the qCell number and pCell ID. For example, the first (left-most) pCell of the attribute plane was compressed using P2 compression and is from pCell 1a.

Throughout the four qCells, the attribute plane is consistently encoded using P2 compression, the cyan plane is encoded using P4 compression, and the yellow plane is encoded using DCTP compression. The magenta plane, however, is encoded using a mix of P2 and D1 compression.

Notably, 13 consecutive, identical pCells of the magenta plane are encoded in a run of D1 compression.

FIG. 11B depicts an interleaved encoding of the pCells and qCells of FIG. 11A. Each of the color and attribute planes are interleaved one-by-one-by-one-by-one, except for when a run is encoded in a more efficient fashion. For instance, the encoding begins with the pCells of the first qCell. First is the 1a pCell of the attribute plane, then the 1a pCell of the cyan plane, the 1a pCell of the magenta plane, the 1a pCell of the yellow plane, the 1b pCell of the attribute plane, the 1b pCell of the cyan plane, and so on.

With respect to the run of 13 magenta cells using D1 compression, the 7th pCell in the output sequence indicates that a D1 run begins. Particularly, this pCell is one of three pCells in the D1 run that are from the first qCell. Thus, this pCell may be encoded using D1 compression and may include a length field with a value of 3 to indicate that it represents three consecutive, identical D1 pCells. Accordingly, the 1b, 1c, and 1d magenta pCells are encoded as a single pCell, and the 1c and 1d magenta pCells are omitted from the output sequence.

For the second qCell, the first magenta pCell therein appears in the 17th position in the output sequence. However, a D1C encoding is used to indicate that the run of magenta D1 pCells continues through this qCell. Similarly, for the third qCell, the first magenta pCell therein appears in the 30th position in the output sequence. Here, a D1C encoding is also used to indicate that the run of magenta D1 pCells continues through this qCell. Other magenta pCells in the second and third qCells are omitted in this encoding.

In the fourth qCell, the run of magenta D1 pCells continues for two more pCells, and then ends. Therefore, at the 43rd position in the output sequence, a D1E encoding is used to indicate the end of the D1 run. But, since there actually are two remaining consecutive, identical magenta D1 pCells in the run, a second D1 run is encoded. In the 44th position in the output sequence, a magenta pCell may be encoded using D1 compression. This pCell may include a length field with a value of 2 to indicate that it represents two consecutive identical D1 pCells. Thus, the 4b magenta pCell is omitted from the encoding, but the 4c and 4d magenta pCells are included.

The final encoding, in the 57th output position, is an end-of-file (EOF) used to indicate the end of this section of the compressed representation.

Figure 12A:
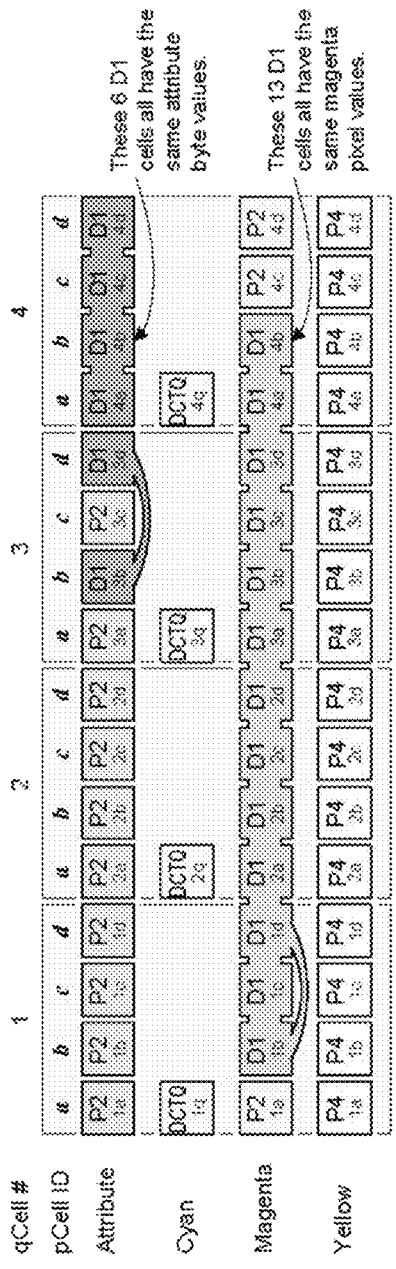
FIG. 12A depicts cells of four planes, according to example embodiments.
Figure 12B:
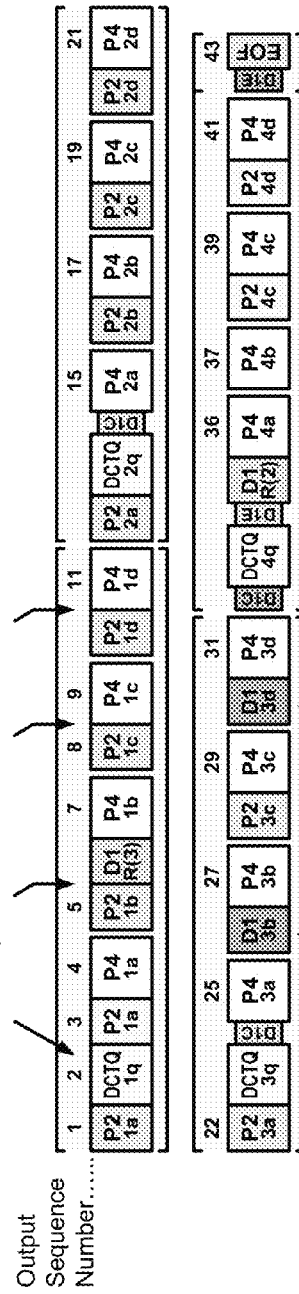
FIG. 12B depicts the cells of FIG. 12A interleaved on an output medium, according to example embodiments.

Another example of an interleaving operation is shown in FIGS. 12A and 12B. FIG. 12A depicts a series of four qCells for each of the attribute, cyan, magenta, and yellow planes. However, unlike the example of FIGS. 11A and 11B, the example of FIG. 12A includes DCTQ encodings, as well as an implicit D1 run.

FIG. 12B depicts an interleaved encoding of the pCells and qCells of FIG. 12A. Each of the color and attribute planes are interleaved one-by-one-by-one-by-one, except for when a run is encoded in a more efficient fashion. With respect to the DCTQ encodings, since such an encoding encompasses four actual pCells, only one DCTQ encoding per qCell may be used. Therefore, in FIG. 12B, cyan DCTQ encodings appear at the 2nd, 13th, 23rd, and 33rd output positions, respectively.

Like FIG. 11B, the run of 13 magenta D1 pCells are compressed into two logical runs in FIG. 12B. However, the run of six consecutive, identical attribute D1 pCells are encoded in a slightly different fashion. Since the run begins with the b and d pCells of a qCell, the beginning of the run is considered to be implicit. Thus, these two pCells are encoded as expected at the 26th and 30th output positions, respectively. However, at the 32nd output position, a D1C encoding is used for the four D1 cells of this run that are in the fourth qCell. Then, at the 42nd output position, a D1E encoding is used to indicate the end of the run, and at the 43rd output position an EOF encoding is used to indicate the end of this section of the compressed representation.

FIGS. 11A, 11B, 12A, and 12B are provided for purposes of illustration. Other encodings may be supported by the embodiments herein, and variations may be made to these encodings without departing from the scope of the embodiments.

11. EXAMPLE CELL-BASED DECOMPRESSION

Once a number of pCells and/or qCells are compressed using, for example, the compression methods and encodings discussed above, they may be efficiently stored and/or transmitted over a cable or network. Nonetheless, at some point, the pCells and/or qCells may be decompressed into the original image or an approximation of the original image. Since the cell-based compression techniques described herein can be lossy, the decompressed image may differ, at least to some extent, from the original image. However, in many scenarios, this difference will either be unlikely to be perceived by a human, or considered to be an acceptable version of the original image.

The pCells and/or qCells encoded with the compression encodings described above can be decoded and decompressed as follows. For a particular pCell or qCell encoding, the opcode is read. Based on the value of the opcode, any applicable options, arguments, bitmaps, etc., can be determined from the bits following the opcode. From these parameters, a decompressed version of the pCell or qCell can be reconstructed. Then, the next opcode is read and so on until the image is reconstructed.

For example, if the opcode is 001, indicating D1 encoding, the V' bit and the arguments field may be read to determine the value of the compressed element. The length bits may also be read to determine whether a run length is present. Then, a number of cells commensurate with the run length are created with all pixels in each cell exhibiting the value indicated by the value field in the encoding, or in a cached version of the value field.

If the opcode is 000, indicating D1D encoding, the V bit may be read to determine the value of the compressed element, and the length bits may be read to determine whether a run length is present. Then, a number of cells commensurate with the run length are created with all pixels in each cell exhibiting the default value indicated by the V bit.

If the opcode is 011, indicating P2 encoding, the options, arguments, and bitmap may be read. If the V' bit is 1, the two values in the cell may be determined. Then, a cell may be created with each pixel taking on one of the two values in accordance with the line map and the bitmap. If the line map is not present, then the line map and bit map from the previous P2 cell are used.

If the opcode is 010, indicating P2D compression, a cell may be created with each pixel taking on one of the two values in accordance with the line map and the bitmap. If the line map is not present, then the line map and bitmap from the previous P2 cell are used.

If the opcode is 100, indicating P4 compression, the line map and values arguments may be read, as well as the bitmap. Then, a cell may be created with each pixel taking on one of the four color values in accordance with the line map and bitmap.

If the opcode is 11, indicating DCTP compression, the bitmap of the DCTP compression method may be read and a cell may be created in accordance with this DCTP encoding.

If the opcode is 101, indicating DCTQ compression, the bitmap of the DCTQ compression method may be read and a pCell may be created in accordance with this DCTQ encoding. Then, each element in pCell may be replaced by a 2×2 block of elements with the same value. The result is a qCell that is an approximate reversal of the DCTQ downsampling process.

If the opcode is 1, indicating D1C compression, then the most recent D1 or D1D cell is copied. If the opcode is 0, indicating D1E compression, the current D1 or D1D run is considered to have ended.

If the opcode is 11, indicating D64 compression, the number of bits per attribute is determined, and then the attributes field is decoded accordingly. The number of bits per attribute may depend on the type of printing device and where in the pipeline that the decompression is occurring.

12. EXAMPLE PERFORMANCE RESULTS

Compression performance of the cell-based compression (CBC) techniques disclosed herein were compared to that of JPEG-based compression and split run length encoding (SRLE) based compression (a lossless technique). The test suite consisted of 408 pages with varying amounts of text, line art, and image content.

TABLE 10

| | Resolution | | | | | |
|---|---|---|---|---|---|---|
| | 600 dpi | | | 1200 dpi | | |
| Algorithm | CBC | JPEG | SRLE | CBC | JPEG | SRLE |
| Max | 606.9:1 | 84.6:1 | 158.3:1 | 1032.2:1 | 140.8:1 | 199.7:1 |
| Min | 6.2:1 | 9.6:1 | 1.7:1 | 23.0:1 | 12.5:1 | 3.1:1 |
| Average | 62.1:1 | 33.4:1 | 13.7:1 | 171.9:1 | 61.8:1 | 22.2:1 |
| Median | 39.1:1 | 32.6:1 | 8.6:1 | 138.5:1 | 63.1:1 | 12.6:1 |

Table 10 provides the compression ratios achieved by CBC, JPEG, and SRLE for both 600 dpi and 1200 dpi images. These results include the maximum, minimum, average, and median compression ratios achieved for each technique.

The CBC technique disclosed herein provides the best maximum compression ratio for both 600 dpi and 1200 dpi images by quite a margin. The CBC technique also provides the best minimum compression ratio for 1200 dpi images, but the JPEG technique provides a slightly better minimum compression ratio for 600 dpi images.

More importantly, the CBC technique disclosed herein provides significantly better average and median compression ratios than JPEG and SRLE, while providing superior image quality over that of JPEG. Consequently, the CBC technique is a significant improvement in printing and printing device technology.

13. EXAMPLE OPERATIONS

Figure 13:
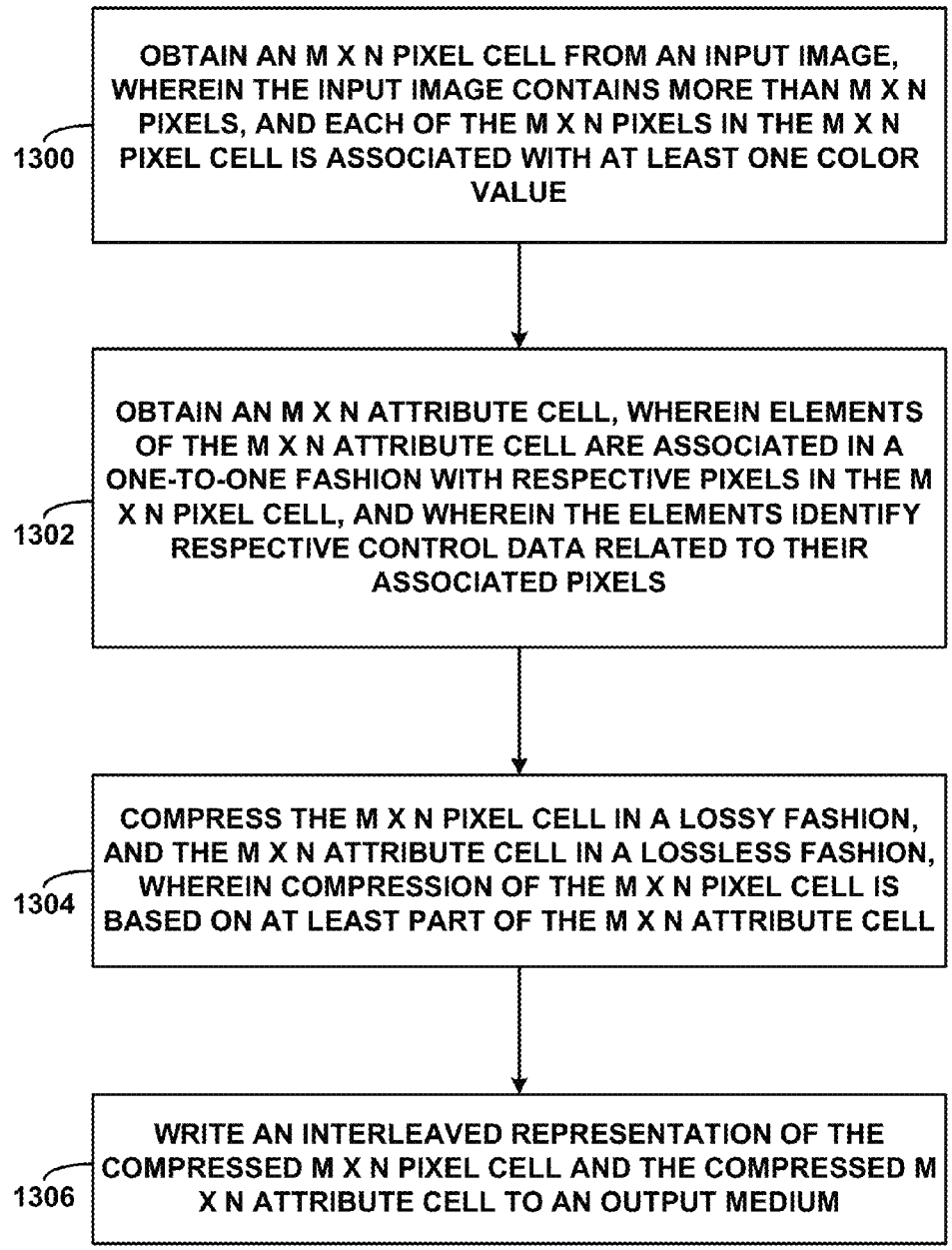
FIG. 13 is a flow chart, according to example embodiments.
Figure 14:
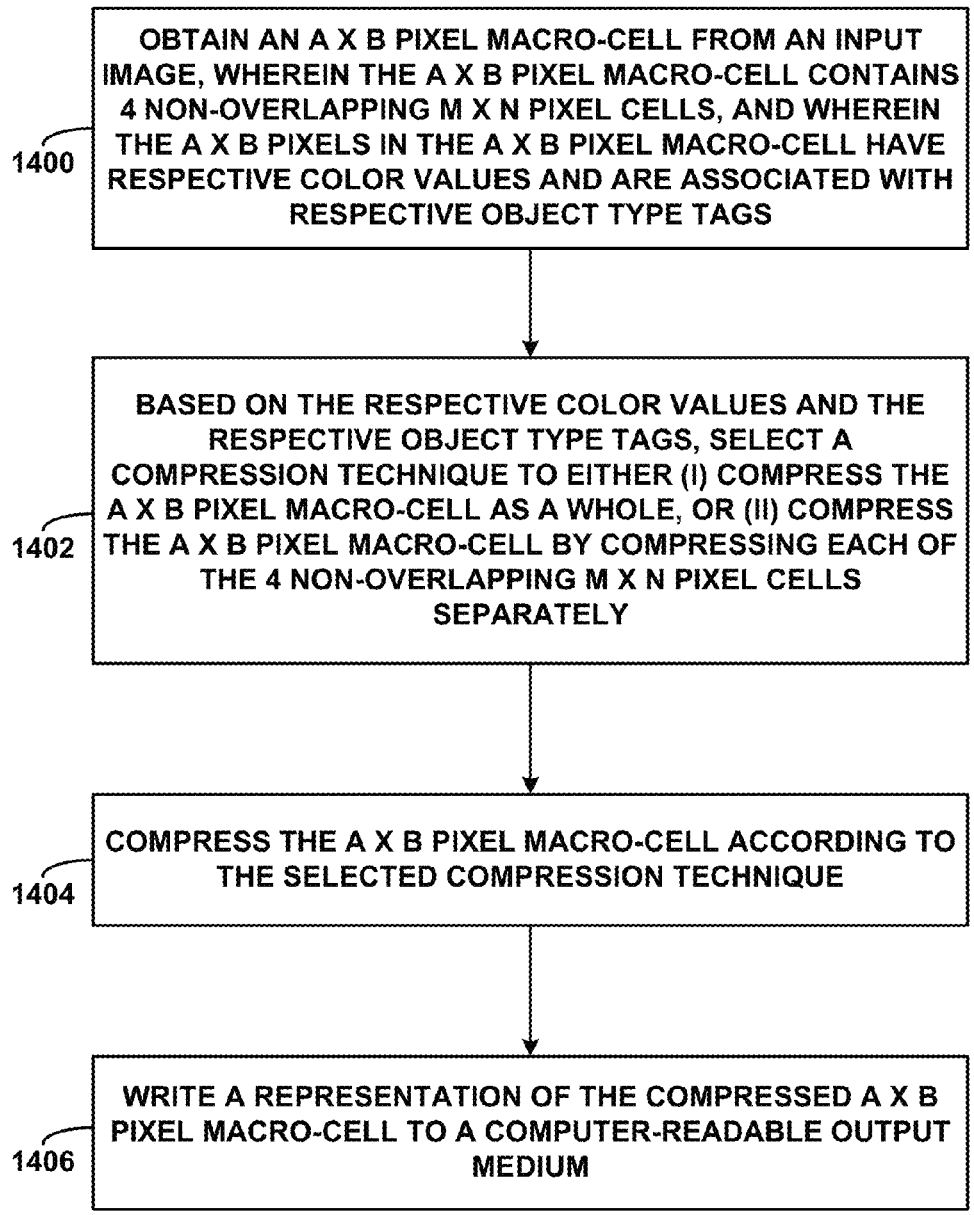
FIG. 14 is another flow chart, according to example embodiments.
Figure 15:
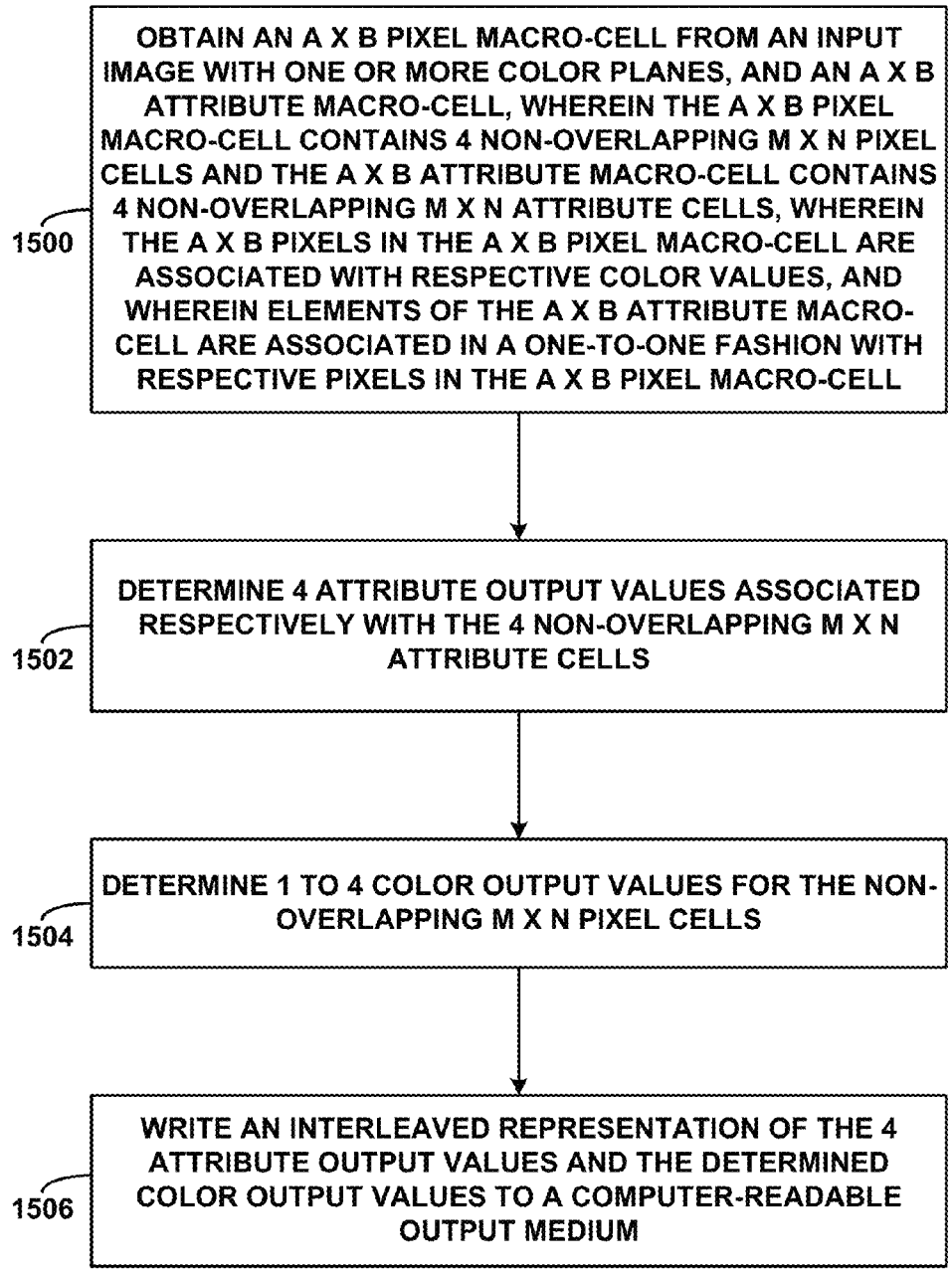
FIG. 15 is yet another flow chart, according to example embodiments.

FIGS. 13, 14, and 15 are flow charts of example embodiments. The steps illustrated by these flow charts may be carried out by one or more printing devices, such as printing device 100, and/or computing devices, such as computing device 300. Further, aspects of each individual step may be distributed between multiple computing or printing devices.

With respect to the terms used herein, an m×n attribute cell may refer to a planar pCell of the attribute plane, and an m×n pixel cell may refer to a planar pCell of a color plane. Further, an a×b attribute cell may refer to a planar qCell of the attribute plane, and an a×b pixel cell may refer to a planar qCell of a color plane. It is assumed throughout that a is greater than m and b is greater than n.

FIG. 13 generally depicts steps for interleaved compression of cells of an attribute plane and cells of one or more color planes. However, these steps may be used for additional purposes as well. Operations discussed in reference to FIGS. 5-12B may be explicitly or implicitly referenced in this flow chart. For instance, the steps of FIG. 13 could take place at blocks 604 and/or 614 of FIG. 6, in other locations of a printing device's pipeline, or by a host computer.

At step 1300, an m×n pixel cell from an input image may be obtained. The input image may contain more than m×n pixels, and each of the m×n pixels in the m×n pixel cell may be associated with at least one color value.

At step 1302, possibly based on the m×n pixel cell, an m×n attribute cell may be obtained. Elements of the m×n attribute cell may be associated in a one-to-one fashion with respective pixels in the m×n pixel cell, and the elements may identify respective control data related to their associated pixels. The attribute cell elements may be attribute arrays and/or attribute bytes.

At step 1304, the m×n pixel cell may be compressed in a lossy fashion, and the m×n attribute cell may be compressed in a lossless fashion. The lossy compression may be DCT-based compression, and the lossless compression may be any of the other compression techniques described herein. Compression of the m×n pixel cell may be based on at least part of the m×n attribute cell (e.g., the compression may depend upon the type of object(s) that the m×n pixel cell represents, as encode by the m×n attribute cell). At step 1306, an interleaved representation of the compressed m×n pixel cell and the compressed m×n attribute cell may be written to an output medium. This interleaved representation may take a form in accordance with the disclosure of FIGS. 11A, 11B, 12A, and 12B, or another form.

In some embodiments, a unit of the control data may be associated with a particular pixel in the m×n pixel cell. The control data may be one or more bits indicating whether the particular pixel represents an image object type, a vector object type, or a text object type. The compressed m×n pixel cell and the compressed m×n attribute cell may be decompressed, and a halftone screen may be selected based on the one or more bits. The m×n pixel cell may be printed (possibly along with the rest of the input image) with the selected halftone screen applied to the particular pixel.

Alternatively or additionally, the control data associated with a particular pixel in the m×n pixel cell may contain one or more bits indicating whether the particular pixel was formed as part of a printing procedure or a scanning procedure. The compressed m×n pixel cell and the compressed m×n attribute cell may be decompressed, and halftone screen may be selected based on the one or more bits. The m×n pixel cell may be printed (possibly along with the rest of the input image) with the selected halftone screen applied to the particular pixel.

Alternatively or additionally, the control data associated with a particular pixel in the m×n pixel cell may contain one or more bits indicating that the particular pixel took on neutral color values before compression. The compressed m×n pixel cell and the compressed m×n attribute cell may be decompressed. Possibly as a result of the one or more bits indicating that the particular pixel took on neutral color values before compression, it may be determined that color values of the particular pixel are not identical, and at least one of the color values may be changed so that the color values are identical.

Alternatively or additionally, the control data associated with a particular pixel in the m×n pixel cell may contain one or more bits indicating that the particular pixel took on non-neutral color values before compression. The compressed m×n pixel cell and the compressed m×n attribute cell may be decompressed. Possibly as a result of the one or more bits indicating that the particular pixel took on non-neutral color values before compression, it may be determined that color values of the particular pixel are identical, and at least one of the color values may be changed so that the color values are not identical.

Alternatively or additionally, the control data associated with a particular pixel in the m×n pixel cell may contain one or more bits indicating that the particular pixel took on identical pure extreme color values before compression. The compressed m×n pixel cell and the compressed m×n attribute cell may be decompressed. Possibly as a result of the one or more bits indicating that the particular pixel took on identical pure extreme color values before compression, it may be determined that color values of the particular pixel are not the identical pure extreme color values, and at least one of the color values may be changed so that the color values are the identical pure extreme color values.

Alternatively or additionally, the control data associated with a particular pixel in the m×n pixel cell may contain one or more bits indicating whether the particular pixel is to be overlaid with a digital object. Compressing the m×n pixel cell in the lossy fashion may involve selecting either (i) the particular pixel, or (ii) a replacement pixel from the digital object, and compressing the selected pixel. The selection may be based on the one or more bits. In some cases, the one or more bits may be omitted from the lossless compression of the m×n attribute cell.

Alternatively or additionally, the control data associated with a particular pixel in the m×n pixel cell may contain one or more bits indicating whether a particular color conversion is to be applied to the particular pixel. Before compressing the m×n pixel cell in the lossy fashion, the particular pixel may be converted from one color model to another color model based on the particular color conversion. In some cases, the one or more bits may be omitted from the lossless compression of the m×n attribute cell.

Compressing the m×n attribute cell in the lossless fashion may involve determining that each element of the m×n attribute cell takes on the same value, and possibly based on this determination, encoding the m×n attribute cell using a single-value opcode (e.g., using D1 or D1D compression) and an indication of the same value. Alternatively, compressing the m×n attribute cell in the lossless fashion may involve determining that each element of the m×n attribute cell takes on one of two different values, and possibly based on this determination, encoding the m×n attribute cell using a two-value opcode (e.g., using P2 or P2D compression), an indication of the two different values, and a bitmap indicating which elements take on each of the two different values.

In yet another aspect, compressing the m×n attribute cell in the lossless fashion may involve determining that each element of the m×n attribute cell takes on one of three or four different values, and possibly based on this determination, encoding the m×n attribute cell using a four-value opcode (e.g., using P4 compression), an indication of the three or four different values, and a bitmap indicating which elements take on each of the three or four different values. In another alternative, compressing the m×n attribute cell in the lossless fashion may involve determining that the elements of the m×n attribute cell take on at least five different values, and possibly based on this determination, encoding the m×n attribute cell using a multi-value opcode (e.g., using D64 compression) and indications of values taken on by each of the elements of the m×n attribute cell.

FIG. 14 generally depicts steps for compression of cells of a color plane. However, these steps may be used for additional purposes as well. Operations discussed in reference to FIGS. 5-12B may be explicitly or implicitly referenced in this flow chart. For instance, the steps of FIG. 14 could take place at blocks 604 and/or 614 of FIG. 6, in other locations of a printing device's pipeline, or by a host computer.

Since this flow chart involves the compression of a single color plane, decisions (such as the decisions of color plane decision tree 800) are taken on a planar basis. Nonetheless, the steps in FIG. 14 could be performed as part of a composite operation that considers multiple color planes simultaneously.

At step 1400, an a×b pixel macro-cell from an input image may be obtained. The a×b pixel macro-cell may contain 4 non-overlapping m×n pixel cells. The a×b pixels in the a×b pixel macro-cell may have respective color values, and may be associated with respective object type tags. These object type tags may each be, for example, one or more bits of an attribute array.

At step 1402, possibly based on the respective color values and the respective object type tags, a compression technique may be selected to either (i) compress the a×b pixel macro-cell as a whole, or (ii) compress the a×b pixel macro-cell by compressing each of the 4 non-overlapping m×n pixel cells separately.

At step 1404, the a×b pixel macro-cell may be compressed according to the selected compression technique. At step 1406, a representation of the compressed a×b pixel macro-cell may be written to a computer-readable output medium.

In some embodiments, the selected compression technique compresses the a×b pixel macro-cell as a whole. This process may involve downsampling the a×b pixel macro-cell to a downsampled m×n pixel cell, and compressing the downsampled m×n pixel cell in a lossy fashion (e.g., using DCTQ compression).

When the a×b pixel macro-cell is compressed as a whole, selecting the compression technique may include (i) determining that a range of the respective color values of the a×b pixels exceeds a predetermined non-zero threshold value, (ii) determining that the respective object type tags for the a×b pixels indicate that the a×b pixels each represent the same object type, (iii) determining that the respective color values of the a×b pixels include at least d colors, where d is at least 2, and (iv) selecting to compress the a×b pixel macro-cell as a whole.

Alternatively, when the a×b pixel macro-cell is compressed as a whole, selecting the compression technique may include (i) determining that a range of the respective color values of the a×b pixels is within a predetermined non-zero threshold value, (ii) determining that the respective object type tags for the a×b pixels indicate that some of the a×b pixels represent different object types, (iii) determining that the respective color values of the a×b pixels include at least d colors, where d is at least 2, and (iv) selecting to compress the a×b pixel macro-cell as a whole.

In another alternative, when the a×b pixel macro-cell is compressed as a whole, selecting the compression technique may include (i) determining that a range of the respective color values of the a×b pixels is within a predetermined non-zero threshold value, (ii) determining that the respective object type tags for the a×b pixels indicate that the a×b pixels each represent an identical object type, (iii) determining that the respective color values of the a×b pixels include more than one color, and (iv) selecting to compress the a×b pixel macro-cell as a whole.

In additional embodiments, the selected compression technique compresses each of the 4 non-overlapping m×n pixel cells separately in a lossless fashion (e.g., using D1, D1D, P2, P2D, or P4 compression).

When the 4 non-overlapping m×n pixel cells are compressed separately in a lossless fashion, selecting the compression technique may involve (i) determining that a range of the respective color values of the a×b pixels exceeds a predetermined non-zero threshold value, (ii) determining that the respective object type tags for the a×b pixels indicate that the a×b pixels each represent the same object type, (iii) determining that the respective color values for each of the one or more m×n pixel cells include less than d colors, where d is at least 2, and (iv) selecting to compress each of the one or more m×n pixel cells separately in a lossless fashion.

Alternatively, selecting the compression technique may involve (i) determining that a range of the respective color values of the a×b pixels is within a predetermined non-zero threshold value, (ii) determining that the respective object type tags for the a×b pixels indicate that some the a×b pixels represent different object types, (iii) determining that the respective color values for each of the one or more m×n pixel cells include less than d colors, where d is at least 2, and (iv) selecting to compress each of the one or more m×n pixel cells separately in a lossless fashion.

In another alternative, selecting the compression technique may involve (i) determining that a range of the respective color values of the a×b pixels exceeds a predetermined non-zero threshold value, (ii) determining that the respective object type tags for the a×b pixels indicate that some the a×b pixels represent different object types, (iii) determining that the respective color values for each of the one or more m×n pixel cells include less than d colors, where d is at least 2, and (iv) selecting to compress each of the one or more m×n pixel cells separately in a lossless fashion.

In yet another alternative, selecting the compression technique may involve (i) determining that a range of the respective color values of the a×b pixels is within a predetermined non-zero threshold value, (ii) determining that the respective object type tags for the a×b pixels indicate that the a×b pixels represent an identical object type, (iii) determining that the respective color values of the a×b pixels each represent an identical color value, and (iv) selecting to compress each of the 4 non-overlapping m×n pixel cells separately in a lossless fashion.

In some embodiments, the selected compression technique may compress one or more m×n pixel cells of the 4 non-overlapping m×n pixel cells separately in a lossy fashion (e.g., DCTP compression).

When the 4 non-overlapping m×n pixel cells are compressed separately in a lossy fashion, selecting the compression technique may involve (i) determining that a range of the respective color values of the a×b pixels exceeds a predetermined non-zero threshold value or that the respective object type tags for the a×b pixels indicate that some the a×b pixels represent different object types, (ii) determining that the respective color values for the a×b pixels include less than 5 colors, (iii) determining that the respective color values for each of the one or more m×n pixel cells include at least d colors, where d is at least 2, and (iv) selecting to compress each of the one or more m×n pixel cells separately in a lossy fashion.

The compressed a×b pixel macro-cell may be decompressed by reversing the compression technique used to compress the a×b pixel macro-cell. Thus, decompressing the compressed a×b pixel macro-cell may result in a second a×b pixel macro-cell, and pixel values of the second a×b pixel macro-cell may be either identical to or may approximate the pixel values of the a×b pixel macro-cell.

In some embodiments, a second a×b pixel macro-cell and a third a×b pixel macro-cell may be obtained from the input image. The second and third a×b pixel macro-cells may each contain 4 non-overlapping m×n pixel cells, and the pixels in each of the second and third a×b pixel macro-cells may also have respective color values and may also be associated with the respective object type tags. In these embodiments, a compression technique may be selected to compress each of the second and third a×b pixel macro-cells by compressing each of the 4 non-overlapping m×n pixel cells of the second a×b pixel macro-cell and the 4 non-overlapping m×n pixel cells of the third a×b pixel macro-cell separately from one another and from the 4 non-overlapping m×n pixel cells of the a×b pixel macro-cell. Accordingly, each of the 4 non-overlapping m×n pixel cells of the second a×b pixel macro-cell and the 4 non-overlapping m×n pixel cells of the third a×b pixel macro-cell may be compressed separately from one another and from the 4 non-overlapping m×n pixel cells of the a×b pixel macro-cell. Representations of the compressed second a×b pixel macro-cell and the compressed third a×b pixel macro-cell may be written to the computer-readable output medium.

FIG. 15 generally depicts steps for interleaving compressed representations of cells from an attribute plane and one or more color planes. However, these steps may be used for additional purposes as well. Operations discussed in reference to FIGS. 5-12B may be explicitly or implicitly referenced in this flow chart. For instance, the steps of FIG. 15 could take place at blocks 604 and/or 614 of FIG. 6, in other locations of a printing device's pipeline, or by a host computer.

At step 1500, an a×b pixel macro-cell may be obtained from an input image with one or more color planes. An a×b attribute macro-cell may also be obtained. The a×b pixel macro-cell may contain 4 non-overlapping m×n pixel cells, and the a×b attribute macro-cell may contain 4 non-overlapping m×n attribute cells. The a×b pixels in the a×b pixel macro-cell may be associated with respective color values, and elements of the a×b attribute macro-cell may be associated in a one-to-one fashion with respective pixels in the a×b pixel macro-cell.

At step 1502, 4 attribute-plane output values associated respectively with the 4 non-overlapping m×n attribute cells may be determined. At step 1504, 1 to 4 color-plane output values for the non-overlapping m×n pixel cells may be determined. At step 1506, an interleaved representation of the 4 attribute-plane output values and the determined color-plane output values may be written to a computer-readable output medium. This interleaved representation may take a form in accordance with the disclosure of FIGS. 11A, 11B, 12A, and/or 12B, or another form.

Further, a second a×b pixel macro-cell may also be obtained from the input image. The second a×b pixel macro-cell may contain a second set of 4 non-overlapping m×n pixel cells, where the a×b pixels in the second a×b pixel macro-cell are also associated with respective color values, and where elements of the a×b attribute macro-cell are associated in a one-to-one fashion with respective pixels in the second a×b pixel macro-cell. A third a×b pixel macro-cell may also be obtained from the input image. The third a×b pixel macro-cell may contain a third set of 4 non-overlapping m×n pixel cells, where the a×b pixels in the third a×b pixel macro-cell are also associated with respective color values, and where elements of the a×b attribute macro-cell are associated in a one-to-one fashion with respective pixels in the third a×b pixel macro-cell. The operations may further involve determining a second set of 1 to 4 color-plane output values for the second set of 4 non-overlapping m×n pixel cells, and determining a third set of 1 to 4 color-plane output values for the third set of 4 non-overlapping m×n pixel cells. The interleaved representation may also include the determined second set of 1 to 4 color-plane output values and the determined third set of 1 to 4 color-plane output values.

In some embodiments, each of the attribute-plane output values and color-plane output values contain respective opcodes and data. Further, the 4 attribute-plane output values may be determined based on lossless compression of the respective 4 non-overlapping m×n attribute cells (e.g., using D1, D1D, P2, P2D, P4, or D64 compression).

In some cases, determining the color-plane output values for the non-overlapping m×n pixel cells may involve determining that each of the 4 non-overlapping m×n pixel cells are compressed separately in a lossy or lossless fashion (e.g., using D1, D1D, P2, P2D, P4, or DCTP compression), and determining 4 color-plane output values, one color-plane output value for each of the 4 non-overlapping m×n pixel cells. Alternatively, determining the color-plane output values for the non-overlapping m×n pixel cells may involve determining that the a×b pixel macro-cell is downsampled and compressed in a lossy fashion (e.g., using DCTQ compression), and determining one output value for the downsampled and compressed a×b pixel macro-cell.

In some embodiments, at least 2 color-plane output values are determined (e.g., using D1, D1D, P2, or P2D compression). Writing the interleaved representation of the 4 attribute-plane output values and the determined color-plane output values may involve determining that a first color-plane output value and a second color-plane output value of the color-plane output values are losslessly compressed in the same fashion, and representing the first color-plane output value with an opcode, a cache miss indicator, and a data field, and representing the second color-plane output value with the opcode and a cache hit indicator. The cache hit indicator may indicate that the second color-plane output value uses the data field of the first color-plane output value.

Alternatively or additionally, writing the interleaved representation of the 4 attribute output values and the determined color-plane output values may involve determining that a particular color-plane output value of the color-plane output values is losslessly compressed using (i) an n−1 bit line map, (ii) a first m-bit line, and (iii) for each bit in the n−1 bit line map that takes on a value of 1, another respective m-bit line. Then, the particular color-plane output value may be represented with an opcode, at least 2 different pixel values, the n−1 bit line map, the first m-bit line, and the respective m-bit lines (e.g., using P2 compression).

In other cases, writing the interleaved representation of the 4 attribute output values and the determined color-plane output values may involve determining that a particular color-plane output value of the color-plane output values is losslessly compressed using (i) an n−1 bit line map, (ii) a first 2m-bit line, and (iii) for each bit in the n−1 bit line map that takes on a value of 1, another respective 2m-bit line. Then, the particular color-plane output value may be represented with an opcode, at least 4 different pixel values, the n−1 bit line map, the first 2m-bit line, and the respective 2m-bit lines (e.g., using P4 compression).

In some embodiments, writing the interleaved representation of the 4 attribute output values and the determined color-plane output values may involve determining that a first output value and a second output value are to be represented on the computer-readable output medium, and that the m×n cells associated with the first output value and the second output value to be represented with identical bitmaps (e.g., using P2 compression with caching). Then, the second output value may be represented with an opcode, two or more color values, and a reference to a first bitmap of the first output value, where the second output value does not include a dedicated bitmap.

Moreover, writing the interleaved representation of the 4 attribute output values and the determined color-plane output values may involve determining that (i) p of the 4 non-overlapping m×n pixel cells are losslessly compressed in an identical fashion, and (ii) contain color values in identical locations as one another, where p is 1, 2, 3, or 4 (e.g., a run of D1 pCells within a qCell). Then, the determined color-plane output values may be represented as at least an opcode and a value of p.

In some situations, writing the interleaved representation of the 4 attribute output values and the determined color-plane output values may involve determining that the 4 non-overlapping m×n pixel cells are losslessly compressed in an identical fashion as one another and a previously-written m×n pixel cell of the same color plane. Then, the determined color-plane output values may be represented as an opcode indicating that the determined color-plane output values are a run of identical encodings (e.g., using D1C compression). Writing the interleaved representation of the 4 attribute output values and the determined color-plane output values may further involve determining that p of the 4 non-overlapping m×n pixel cells (i) are losslessly compressed in an identical fashion as previous m×n pixel cells written to the computer-readable output medium, where the previous m×n pixel cells were represented as the run of identical encodings, and (ii) are to be written to the computer-readable output medium before any remaining 4-p non-overlapping m×n pixel cells, where p is 0, 1, 2, or 3. Then, determined color-plane output values may be represented as (i) a first opcode indicating an end to the run of identical encodings (e.g., using a D1E encoding), and (ii) when p is greater than 0, a second opcode and a value of p (e.g., a run of D1 pCells within a qCell).

14. CONCLUSION

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent from the foregoing descriptions. Such modifications and variations are intended to fall within the scope of the appended claims.

With respect to any or all of the ladder diagrams, scenarios, and flow charts in the figures and as discussed herein, each block and/or communication may represent a processing of information and/or a transmission of information in accordance with example embodiments. Alternative embodiments may be included within the scope of such example embodiments. Further, more or fewer blocks and/or functions may be used with any of the ladder diagrams, scenarios, and flow charts discussed herein, and these ladder diagrams, scenarios, and flow charts may be combined with one another, in part or in whole.

A step or block that represents a processing of information may correspond to circuitry that can be configured to perform the specific logical functions of a herein-described method or technique. Alternatively or additionally, a step or block that represents a processing of information may correspond to a module, a segment, or a portion of program code (including related data). The program code may include one or more instructions executable by a processor for implementing specific logical functions or actions in the method or technique. The program code and/or related data may be stored on any type of computer-readable medium, such as a storage device, including a disk drive, a hard drive, or other storage media.

The computer-readable medium may also include non-transitory computer-readable media such as computer-readable media that stores data for short periods of time like register memory, processor cache, and/or random access memory (RAM). The computer-readable media may also include non-transitory computer-readable media that stores program code and/or data for longer periods of time, such as secondary or persistent long term storage, like read only memory (ROM), optical or magnetic disks, and/or compact-disc read only memory (CD-ROM), for example. The computer-readable media may also be any other volatile or non-volatile storage systems. A computer-readable medium may be considered a computer-readable storage medium, for example, and/or a tangible storage device.

Additionally, any enumeration of elements, blocks, or steps in this specification, the drawings, or the claims is for purposes of clarity. Thus, such enumeration should not be interpreted to require or imply that these elements, blocks, or steps adhere to a particular arrangement or are carried out in a particular order.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A computer-implemented method comprising execution, by a processor, of operations including:
obtaining, from a memory, (i) a digital image containing one or more color planes, and (ii) an attribute plane, wherein the digital image comprises a plurality of non-overlapping a×b pixel macro-cells, pixels therein respectively associated with color values, and wherein the attribute plane comprises a plurality of non-overlapping a×b attribute macro-cells;
applying compression to each of the a×b pixel macro-cells and the a×b attribute macro-cells, wherein applying the compression comprises:
selecting, from the digital image, a particular a×b pixel macro-cell that contains 4 non-overlapping m×n pixel cells, pixels of which are respectively associated in a one-to-one fashion with elements of a particular a×b attribute macro-cell that contains 4 non-overlapping m×n attribute cells, and
determining (i) 4 attribute-plane output values respectively associated with the 4 non-overlapping m×n attribute cells, and (ii) 1 to 4 color-plane output values for the 4 non-overlapping m×n pixel cells; and
storing, in the memory, a compressed representation of the digital image and the attribute plane, including therein an interleaved representation of (i) the 4 attribute-plane output values, and (ii) the 1 to 4 color-plane output values.

2. The computer-implemented method of claim 1, wherein each of the 4 attribute-plane output values and the 1 to 4 color-plane output values contain respective opcodes and data.

3. The computer-implemented method of claim 1, wherein the 4 attribute-plane output values are determined based on lossless compression of the non-overlapping m×n attribute cells.

4. The computer-implemented method of claim 1, wherein the determining of the 1 to 4 color-plane output values comprises:
determining that each of the 4 non-overlapping m×n pixel cells are compressed separately in a lossy or lossless fashion; and
determining 4 color-plane output values, one color-plane output value for each of the 4 non-overlapping m×n pixel cells.

5. The computer-implemented method of claim 1, wherein the determining of the 1 to 4 color-plane output values comprises:
determining that the particular a×b pixel macro-cell is to be downsampled and compressed in a lossy fashion; and
determining 1 color-plane output value for the downsampled and compressed particular a×b pixel macro-cell.

6. The computer-implemented method of claim 1, wherein a second particular a×b pixel macro-cell is also selected from the digital image, wherein the second particular a×b pixel macro-cell contains a second set of 4 non-overlapping m×n pixel cells, wherein a×b pixels in the second particular a×b pixel macro-cell are also associated with respective color values, wherein elements of the particular a×b attribute macro-cell are associated in a one-to-one fashion with respective pixels in the second particular a×b pixel macro-cell, wherein a third particular a×b pixel macro-cell is also selected from the digital image, wherein the third particular a×b pixel macro-cell contains a third set of 4 non-overlapping m×n pixel cells, wherein a×b pixels in the third particular a×b pixel macro-cell are also associated with respective color values, wherein elements of the particular a×b attribute macro-cell are associated in a one-to-one fashion with respective pixels in the third particular a×b pixel macro-cell, and wherein the computer-implemented method further comprises:

determining a second set of 1 to 4 color-plane output values for the second set of 4 non-overlapping m×n pixel cells; and determining a third set of 1 to 4 color-plane output values for the third set of 4 non-overlapping m×n pixel cells, wherein the interleaved representation includes the determined second set of 1 to 4 color-plane output values and the determined third set of 1 to 4 color-plane output values.

7. The computer-implemented method of claim 1, wherein at least 2 color-plane output values are determined, and wherein storing the interleaved representation of (i) the 4 attribute plane output values, and (ii) the at least 2 color-plane output values comprises:

determining that a first color-plane output value and a second color-plane output value of the at least 2 color-plane output values are losslessly compressed in the same fashion; and representing the first color-plane output value with an opcode, a cache miss indicator, and a data field, and representing the second color-plane output value with the opcode and a cache hit indicator, wherein the cache hit indicator indicates that the second color-plane output value uses the data field of the first color-plane output value.

8. The computer-implemented method of claim 1, wherein storing the interleaved representation of (i) the 4 attribute-plane output values, and (ii) the 1 to 4 color-plane output values comprises:

determining that a particular color-plane output value of the 1 to 4 color-plane output values is losslessly compressed using (i) an n−1 bit line map, (ii) a first m-bit line, and (iii) for each bit in the n−1 bit line map that takes on a value of 1, another respective m-bit line; and representing the particular color-plane output value with an opcode, at least 2 different pixel values, the n−1 bit line map, the first m-bit line, and each respective m-bit line.

9. The computer-implemented method of claim 1, wherein storing the interleaved representation of (i) the 4 attribute-plane output values, and (ii) the 1 to 4 color-plane output values comprises:

determining that a particular color-plane output value of the 1-4 color-plane output values is losslessly compressed using (i) an n−1 bit line map, (ii) a first 2m-bit line, and (iii) for each bit in the n−1 bit line map that takes on a value of 1, another respective 2m-bit line; and representing the particular color-plane output value with an opcode, at least 4 different pixel values, the n−1 bit line map, the first 2m-bit line, and each respective 2m-bit line.

10. The computer-implemented method of claim 1, wherein storing the interleaved representation of (i) the 4 attribute-plane output values, and (ii) the 1 to 4 color-plane output values comprises:

determining that a first output value and a second output value are to be stored in the memory, and that the m×n pixel cells associated with the first output value and the second output value are to be represented with identical bitmaps; and representing the second output value with an opcode, 2 or more color values, and a reference to a first bitmap of the first output value, wherein the second output value does not include a dedicated bitmap.

11. The computer-implemented method of claim 1, wherein storing the interleaved representation of (i) the 4 attribute-plane output values, and (ii) the 1 to 4 color-plane output values comprises:

determining that (i) p of the 4 non-overlapping m×n pixel cells are losslessly compressed in an identical fashion, and (ii) contain color values in identical locations as one another, wherein p is 1, 2, 3, or 4; and representing the 1 to 4 color-plane output values as at least an opcode, a pixel value, and a value of p.

12. The computer-implemented method of claim 1, wherein storing the interleaved representation of (i) the 4 attribute-plane output values, and (ii) the 1 to 4 color-plane output values comprises:

determining that the 4 non-overlapping m×n pixel cells are losslessly compressed in an identical fashion as one another and a previous m×n pixel cell of the same color plane; and representing the 1 to 4 color-plane output values as an opcode indicating that the 1 to 4 color-plane output values are a run of identical encodings.

13. The computer-implemented method of claim 12, wherein storing the interleaved representation of (i) the 4 attribute-plane output values, and (ii) the 1 to 4 color-plane output values further comprises:

determining that p of the 4 non-overlapping m×n pixel cells (i) are losslessly compressed in an identical fashion as previous m×n pixel cells, wherein the previous m×n pixel cells were represented as the run of identical encodings, and (ii) are to be stored in the memory before any remaining 4-p non-overlapping m×n pixel cells, wherein p is 0, 1, 2, or 3; and representing the 1 to 4 color-plane output values as (i) a first opcode indicating an end to the run of identical encodings, and (ii) when p is greater than 0, a second opcode, a pixel value, and a value of p.

14. An article of manufacture including a non-transitory computer-readable medium, having stored thereon program instructions that, upon execution by a processor, cause the processor to perform operations comprising:

obtaining (i) a digital image containing one or more color planes, and (ii) an attribute plane, wherein the digital image comprises a plurality of non-overlapping a×b pixel macro-cells, pixels therein respectively associated with color values, and wherein the attribute plane comprises a plurality of non-overlapping a×b attribute macro-cells;

applying compression to each of the a×b pixel macro-cells and the a×b attribute macro-cells, wherein applying the compression comprises:

selecting, from the digital image, a particular a×b pixel macro-cell that contains 4 non-overlapping m×n pixel cells, pixels of which are respectively associated in a one-to-one fashion with elements of a particular a×b attribute macro-cell that contains 4 non-overlapping m×n attribute cells, and determining (i) 4 attribute-plane output values respectively associated with the 4 non-overlapping m×n attribute cells, and (ii) 1 to 4 color-plane output values for the 4 non-overlapping m×n pixel cells; and storing a compressed representation of the digital image and the attribute plane, including therein an interleaved representation of (i) the 4 attribute-plane output values, and (ii) the 1 to 4 color-plane output values.

15. The article of manufacture of claim 14, wherein the 4 attribute-plane output values are determined based on lossless compression of the 4 non-overlapping m×n attribute cells.

16. The article of manufacture of claim 14, wherein the determining of the 1 to 4 color-plane output values comprises:
- determining that each of the 4 non-overlapping m×n pixel cells are compressed separately in a lossy or lossless fashion; and
- determining 4 color-plane output values, one color-plane output value for each of the 4 non-overlapping m×n pixel cells.

17. The article of manufacture of claim 14, wherein the determining of the 1 to 4 color-plane output values comprises:
- determining that the a×b pixel macro-cell is to be down-sampled and compressed in a lossy fashion; and
- determining 1 color-plane output value for the down-sampled and compressed a×b pixel macro-cell.

18. A printing device comprising:
- at least one processor;
- memory; and
- program instructions, stored in the memory, that upon execution by the at least one processor cause the printing device to perform operations comprising:
  - obtaining, from the memory, (i) a digital image containing one or more color planes, and (ii) an attribute plane, wherein the digital image comprises a plurality of non-overlapping a×b pixel macro-cells, pixels therein respectively associated with color values, and wherein the attribute plane comprises a plurality of non-overlapping a×b attribute macro-cells;
  - applying compression to each of the a×b pixel macro-cells and the a×b attribute macro-cells, wherein applying the compression comprises:
    - selecting, from the digital image, a particular a×b pixel macro-cell that contains 4 non-overlapping m×n pixel cells, pixels of which are respectively associated in a one-to-one fashion with elements of a particular a×b attribute macro-cell that contains 4 non-overlapping m×n attribute cells, and
    - determining (i) 4 attribute-plane output values respectively associated with the 4 non-overlapping m×n attribute cells, and (ii) 1 to 4 color-plane output values for the 4 non-overlapping m×n pixel cells; and
  - storing, in the memory, a compressed representation of the digital image and the attribute plane, including therein an interleaved representation of (i) the 4 attribute-plane output values, and (ii) the 1 to 4 color-plane output values.

19. The printing device of claim 18, wherein the 4 attribute-plane output values are determined based on lossless compression of the 4 non-overlapping m×n attribute cells.

20. The printing device of claim 18, wherein the determining of the 1 to 4 color-plane output values comprises:
- determining that each of the 4 non-overlapping m×n pixel cells are compressed separately in a lossy or lossless fashion; and
- determining 4 color-plane output values, one color-plane output value for each of the 4 non-overlapping m×n pixel cells.

* * * * *